United States Patent
Wu et al.

(10) Patent No.: US 11,430,745 B2
(45) Date of Patent: Aug. 30, 2022

(54) SEMICONDUCTOR DIE CONTAINING SILICON NITRIDE STRESS COMPENSATING REGIONS AND METHOD FOR MAKING THE SAME

(71) Applicant: SANDISK TECHNOLOGIES LLC, Addison, TX (US)

(72) Inventors: Chen Wu, Leuven (BE); Peter Rabkin, Cupertino, CA (US); Yangyin Chen, Leuven (BE); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 135 days.

(21) Appl. No.: 16/806,087

(22) Filed: Mar. 2, 2020

(65) Prior Publication Data
US 2021/0272912 A1 Sep. 2, 2021

(51) Int. Cl.
*H01L 23/00* (2006.01)
*H01L 25/065* (2006.01)
*H01L 21/02* (2006.01)

(52) U.S. Cl.
CPC ........ *H01L 23/562* (2013.01); *H01L 21/0217* (2013.01); *H01L 21/02354* (2013.01); *H01L 24/08* (2013.01); *H01L 24/80* (2013.01); *H01L 25/0657* (2013.01); *H01L 2224/08147* (2013.01); *H01L 2224/08148* (2013.01); *H01L 2224/80895* (2013.01); *H01L 2224/80896* (2013.01)

(58) Field of Classification Search
None
See application file for complete search history.

(56) References Cited

U.S. PATENT DOCUMENTS

| | | |
|---|---|---|
| 5,915,167 A | 6/1999 | Leedy |
| 9,343,358 B1 | 5/2016 | Xu |
| (Continued) | | |

OTHER PUBLICATIONS

Endoh et al., "Novel Ultra High Density Memory with a Stacked-Surrounding Gate Transistor (S-SGT) Structured Cell," IEDM Proc. pp. 33-36, (2001).

(Continued)

*Primary Examiner* — Michelle Mandala
(74) *Attorney, Agent, or Firm* — The Marbury Law Group PLLC

(57) ABSTRACT

A method of forming a semiconductor structure includes forming first semiconductor devices over a first substrate, forming a first dielectric material layer over the first semiconductor devices, forming vertical recesses in the first dielectric material layer, such that each of the vertical recesses vertically extends from a topmost surface of the first dielectric material layer toward the first substrate, forming silicon nitride material portions in each of the vertical recesses; and locally irradiating a second subset of the silicon nitride material portions with a laser beam. A first subset of the silicon nitride material portions that is not irradiated with the laser beam includes first silicon nitride material portions that apply tensile stress to respective surrounding material portions, and the second subset of the silicon nitride material portions that is irradiated with the laser beam includes second silicon nitride material portions that apply compressive stress to respective surrounding material portions.

7 Claims, 22 Drawing Sheets

(56) References Cited

U.S. PATENT DOCUMENTS

| | | | |
|---|---|---|---|
| 9,419,135 | B2 | 8/2016 | Baenninger et al. |
| 9,455,267 | B2 | 9/2016 | Zhang et al. |
| 9,698,223 | B2 | 7/2017 | Sharangpani et al. |
| 9,799,671 | B2 | 10/2017 | Pachamuthu et al. |
| 9,887,207 | B2 | 2/2018 | Zhang et al. |
| 9,917,093 | B2 | 3/2018 | Chu et al. |
| 10,103,161 | B2 | 10/2018 | Ito et al. |
| 10,115,681 | B1 | 10/2018 | Ariyoshi |
| 10,242,994 | B2 | 3/2019 | Inomata et al. |
| 10,283,493 | B1 | 5/2019 | Nishida |
| 10,354,980 | B1 | 7/2019 | Mushiga et al. |
| 10,354,987 | B1 | 7/2019 | Mushiga et al. |
| 10,355,012 | B2 | 7/2019 | Shimabukuro et al. |
| 10,381,322 | B1 | 8/2019 | Azuma et al. |
| 10,381,362 | B1 | 8/2019 | Cui et al. |
| 10,510,738 | B2 | 12/2019 | Kim et al. |
| 2002/0014673 | A1 | 2/2002 | Leedy |
| 2002/0045297 | A1 | 4/2002 | Leedy |
| 2003/0057513 | A1 | 3/2003 | Leedy |
| 2003/0162368 | A1 | 8/2003 | Connell et al. |
| 2003/0218182 | A1 | 11/2003 | Leedy |
| 2003/0223535 | A1 | 12/2003 | Leedy |
| 2004/0132303 | A1 | 7/2004 | Leedy |
| 2004/0150068 | A1 | 8/2004 | Leedy |
| 2004/0192045 | A1 | 9/2004 | Leedy |
| 2004/0197951 | A1 | 10/2004 | Leedy |
| 2005/0051841 | A1 | 3/2005 | Leedy |
| 2005/0082626 | A1 | 4/2005 | Leedy |
| 2005/0082641 | A1 | 4/2005 | Leedy |
| 2005/0130351 | A1 | 6/2005 | Leedy |
| 2005/0156265 | A1 | 7/2005 | Leedy |
| 2005/0176174 | A1 | 8/2005 | Leedy |
| 2006/0094193 | A1* | 5/2006 | Horstmann ....... H01L 21/26506 438/299 |
| 2008/0302559 | A1 | 12/2008 | Leedy |
| 2013/0041235 | A1 | 2/2013 | Rogers et al. |
| 2013/0231870 | A1 | 9/2013 | Sugnet et al. |
| 2014/0093881 | A1 | 4/2014 | Sugnet et al. |
| 2014/0353833 | A1 | 12/2014 | Peng et al. |
| 2015/0206845 | A1 | 7/2015 | Lin et al. |
| 2016/0013303 | A1 | 1/2016 | Takada |
| 2016/0049421 | A1 | 2/2016 | Zhang et al. |
| 2016/0086969 | A1 | 3/2016 | Zhang et al. |
| 2016/0141419 | A1 | 5/2016 | Baenninger et al. |
| 2016/0149002 | A1 | 5/2016 | Sharangpani et al. |
| 2016/0300848 | A1 | 10/2016 | Pachamuthu et al. |
| 2017/0194985 | A1 | 7/2017 | Sugnet et al. |
| 2017/0373078 | A1 | 12/2017 | Chu et al. |
| 2017/0373087 | A1 | 12/2017 | Ito et al. |
| 2018/0006049 | A1 | 1/2018 | Inomata et al. |
| 2018/0374865 | A1 | 12/2018 | Shimabukuro et al. |
| 2019/0221557 | A1 | 7/2019 | Kim et al. |
| 2019/0252361 | A1 | 8/2019 | Nishida |
| 2020/0295034 | A1* | 9/2020 | Suzuki ............. H01L 27/11556 |

OTHER PUBLICATIONS

Morin, P. et al., "A Comparison of the Mechanical Stability of Silicon Nitride Films Deposited with Various Techniques," Applied Surface Science, vol. 260, pp. 69-72, (2012).

Volksen, W. et al., "Mechanical Enhancement of Low-k Organosilicates by Laser Spike Annealing, "*Journal of The Electrochemical Society*, vol. 155, No. 10, pp. G224-G230, (2008).

Lee, R.T.P. et al., "Nanosecond Laser Anneal for BEOL Performance Boost in Advanced FinFETs," 2018 Symposium on VLSI Technology Digest of Technical Papers, pp. 61-62, (2018).

Hasegawa, S. et al., "Effects of active hydrogen on the stress relaxation of amorphous SiNx:H films," Journal of Applied Physics, vol. 75, No. 3pp. 1493-1500, (1994); https://doi.org/10.1063/1.356384.

https://www.veeco.com/products/lsa-101-laser-spike-anneal-system.

U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,352, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/263,058, filed Jan. 31, 2019, SanDisk Technologies LLC.
U.S. Appl. No. 16/263,086, filed Jan. 31, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/288,656, filed Feb. 19, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/367,455, filed Mar. 28, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/516,726, filed Jul. 19, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/594,892, filed Oct. 7, 2019, SanDisk Technologies LLC.
U.S. Appl. No. 16/594,959, filed Oct. 7, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.

(56) References Cited

OTHER PUBLICATIONS

U.S. Appl. No. 16/694,400, filed Nov. 25, 2019, SanDisk Technologies LLC.
U.S. Appl. No. 16/694,438, filed Nov. 25, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/747,943, filed Jan. 21, 2020, SanDisk Technologies LLC.
U.S. Appl. No. 16/774,372, filed Jan. 28, 2020, SanDisk Technologies LLC.
Notification of Transmillal of the International Search Report and Written Opinion of the International Search Authority for International Patent Application No. PCT/US2020/037619, dated Dec. 1, 2020, 11 pages.

* cited by examiner

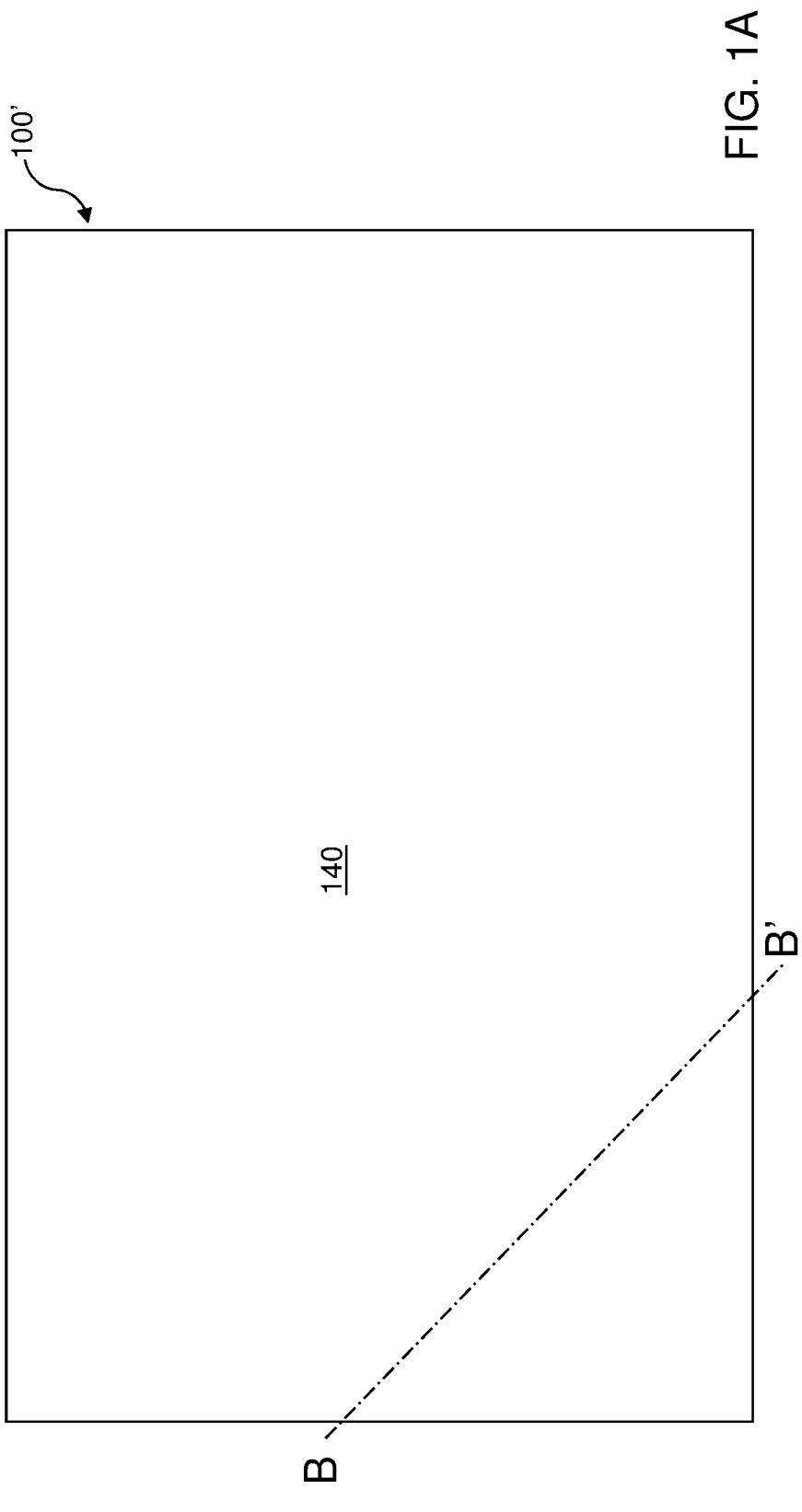
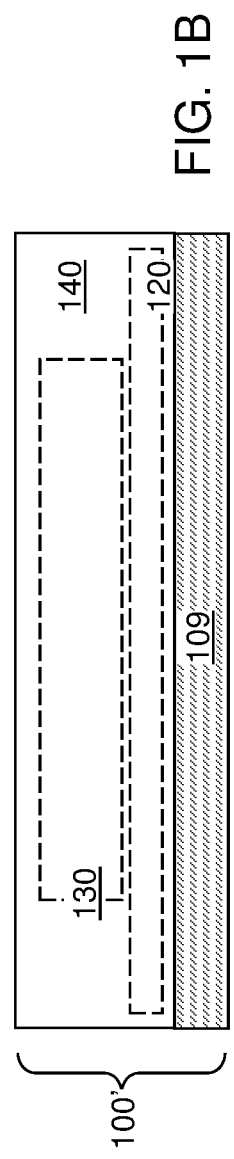

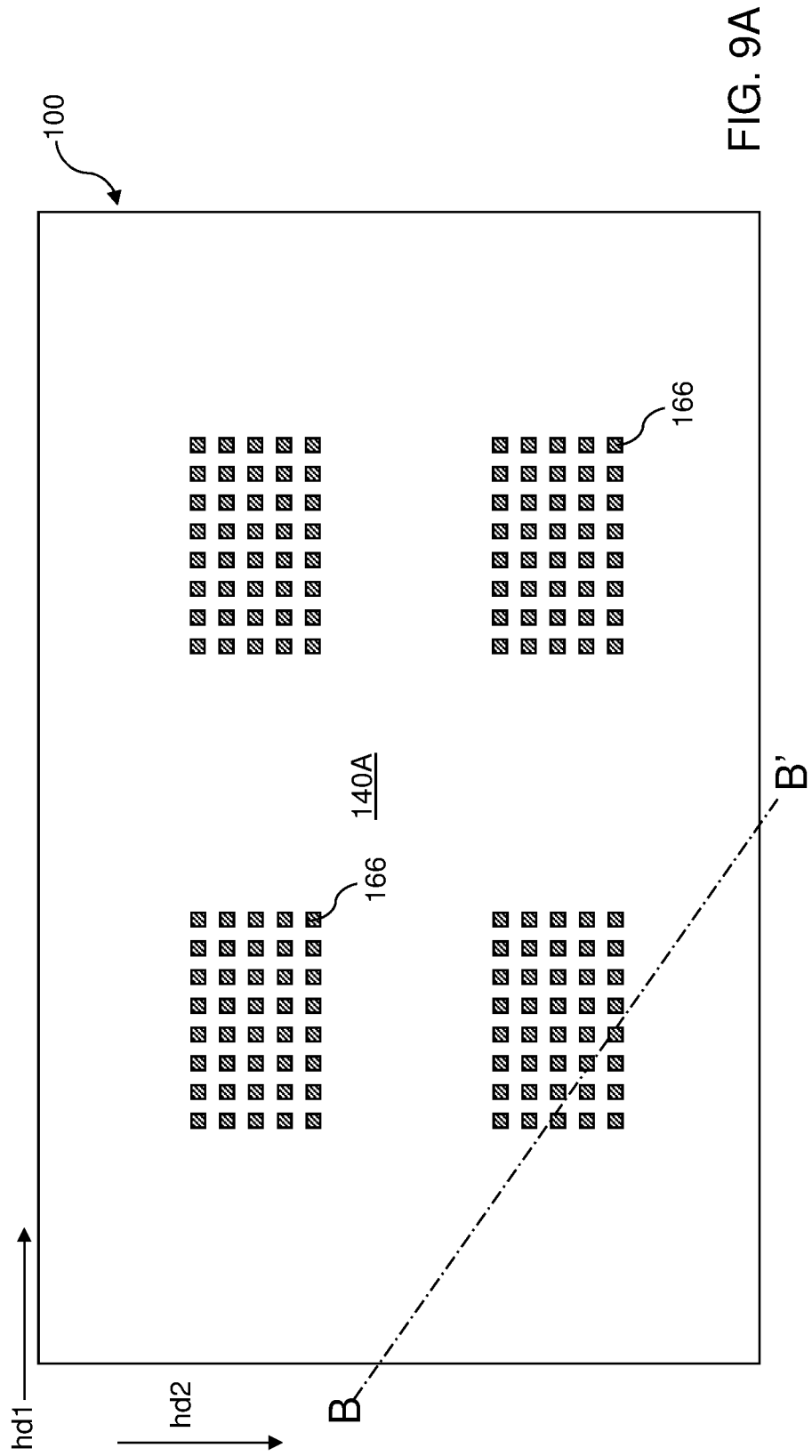
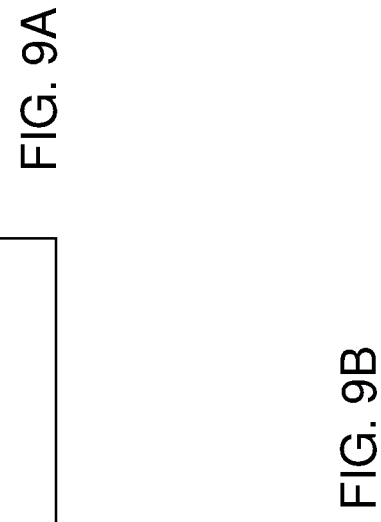

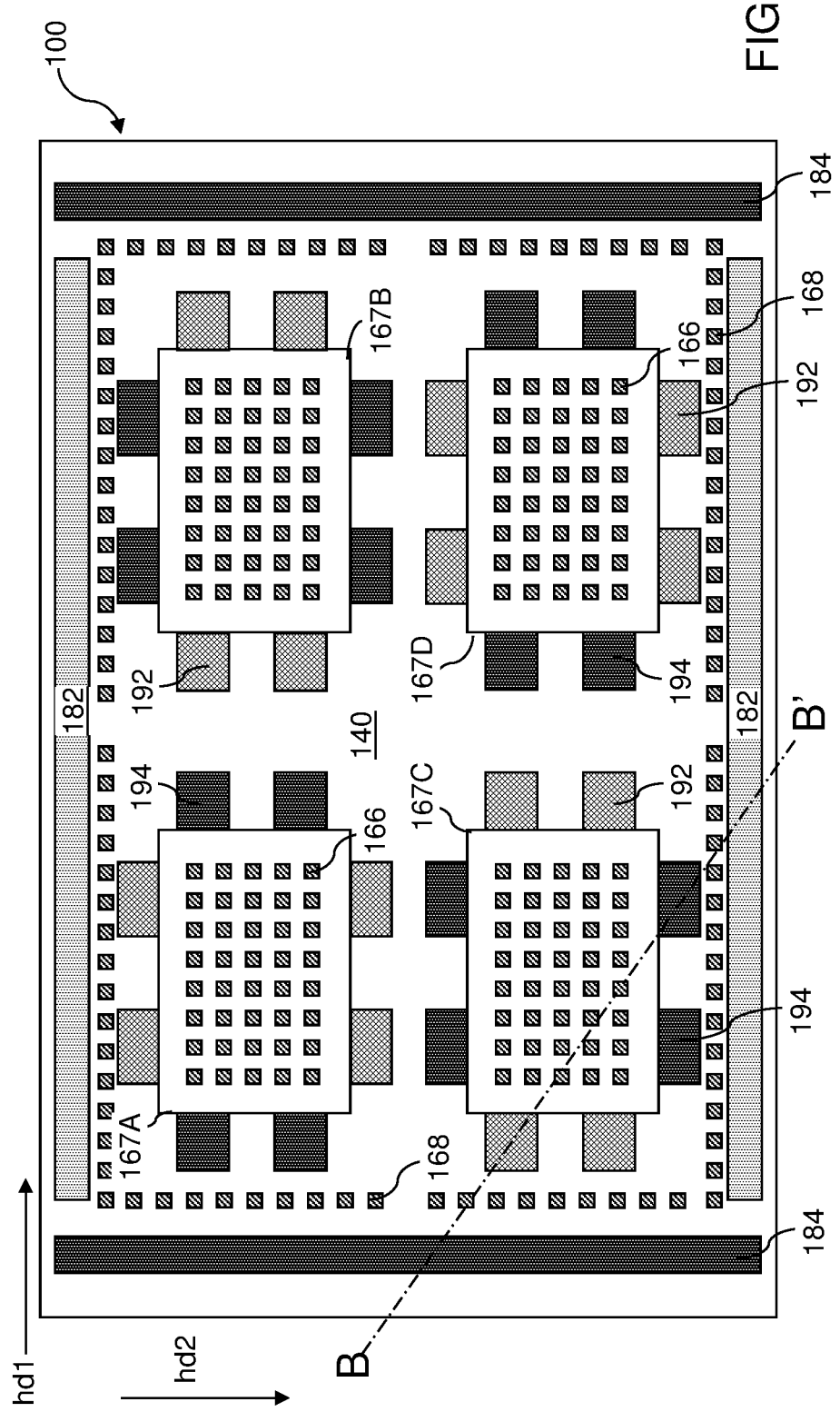
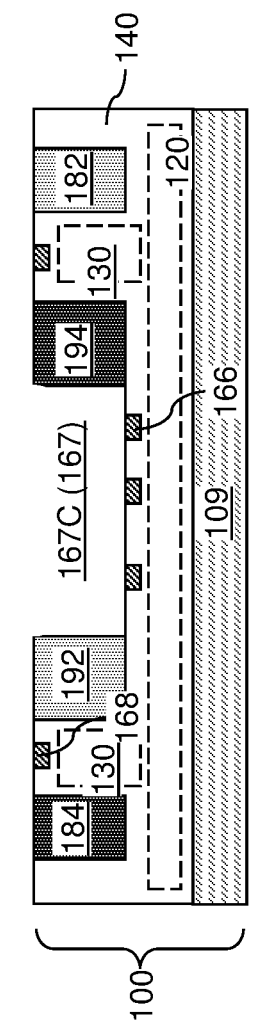
FIG. 16A
FIG. 16B

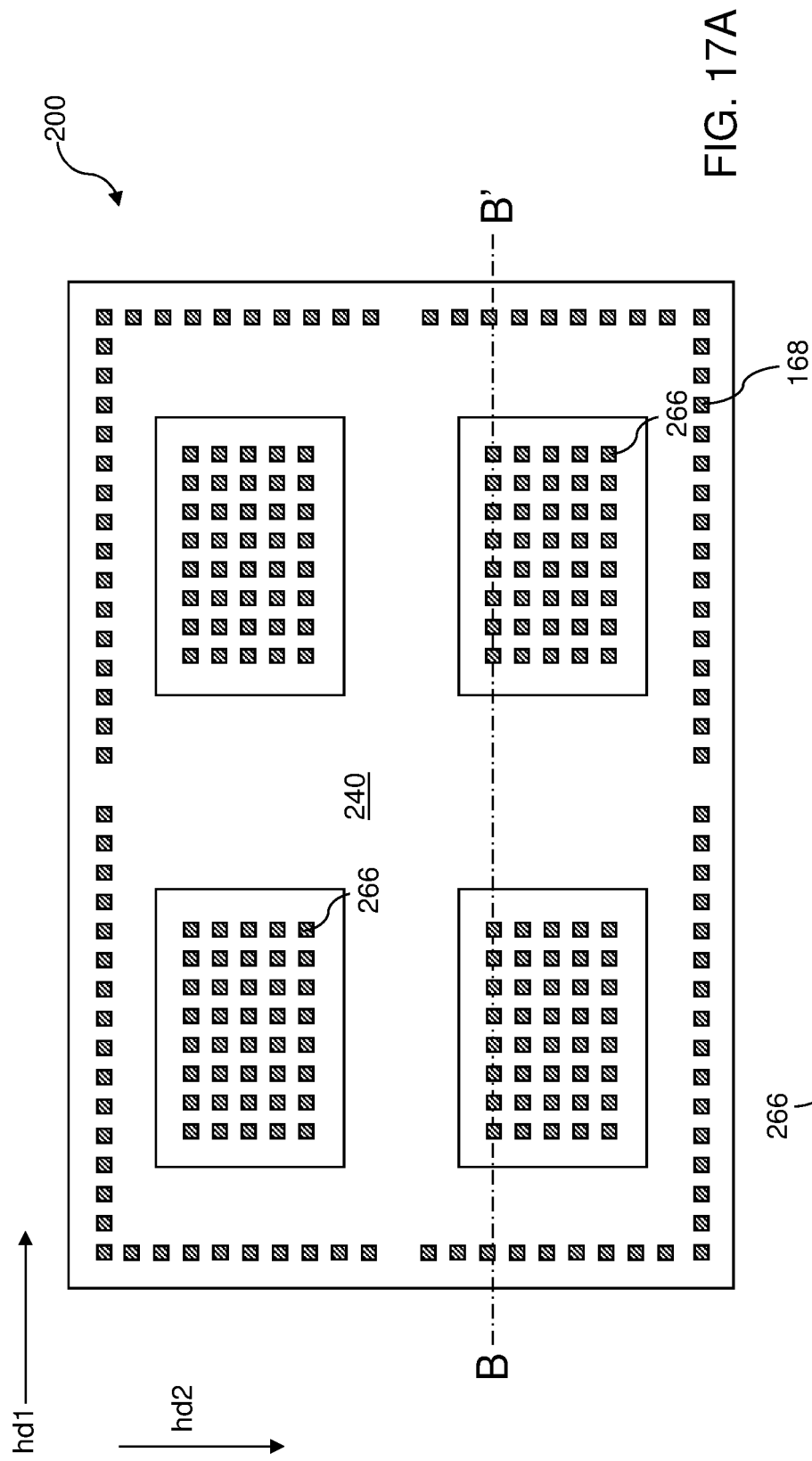

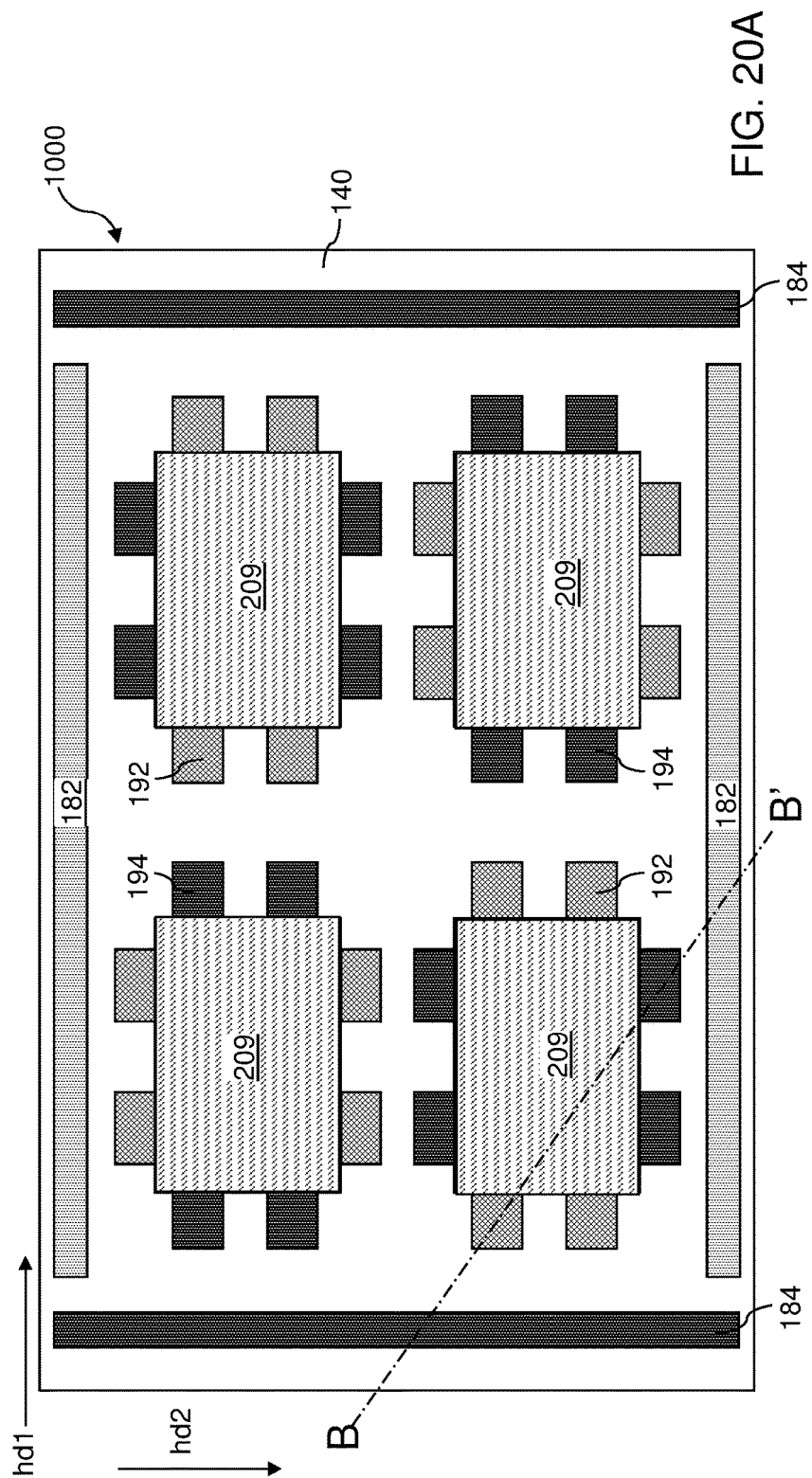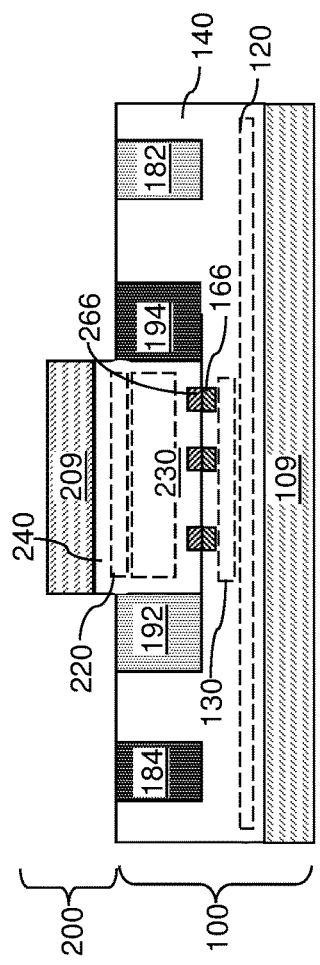

2

SEMICONDUCTOR DIE CONTAINING SILICON NITRIDE STRESS COMPENSATING REGIONS AND METHOD FOR MAKING THE SAME

FIELD

The present disclosure relates generally to the field of semiconductor devices, and particularly to silicon nitride stress compensating regions for reducing warpage of semiconductor die and methods of making the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure comprising a first semiconductor die is provided. The first semiconductor die comprises: a first substrate; first semiconductor devices located over the first substrate; a first dielectric material layer located over the first semiconductor devices; first silicon nitride material portions embedded within an upper portion of the first dielectric material layer and applying tensile stress to respective surrounding material portions; and second silicon nitride material portions embedded within the upper portion of the first dielectric material layer and applying compressive stress to respective surrounding material portions.

According to another aspect of the present disclosure, a method of forming a semiconductor structure includes forming first semiconductor devices over a first substrate, forming a first dielectric material layer over the first semiconductor devices, forming vertical recesses in the first dielectric material layer, such that each of the vertical recesses vertically extends from a topmost surface of the first dielectric material layer toward the first substrate, forming silicon nitride material portions in each of the vertical recesses; and locally irradiating a second subset of the silicon nitride material portions with a laser beam. A first subset of the silicon nitride material portions that is not irradiated with the laser beam includes first silicon nitride material portions that apply tensile stress to respective surrounding material portions, and the second subset of the silicon nitride material portions that is irradiated with the laser beam includes second silicon nitride material portions that apply compressive stress to respective surrounding material portions.

BRIEF DESCRIPTION OF THE DRAWINGS

FIG. 1A is a top-down view of a first exemplary structure including a first semiconductor die after formation of first dielectric material layers according to a first embodiment of the present disclosure.

FIGS. 1B and 1C are different magnifications of vertical cross-sectional views along the vertical plane B-B' of the first exemplary structure of FIG. 1A.

FIG. 9A is a top-down view of a second exemplary structure including a first semiconductor die after formation of lower-level bonding pads embedded in first lower-level dielectric material layers according to a second embodiment of the present disclosure.

FIG. 9B is a vertical cross-sectional view along the vertical plane B-B' of the second exemplary structure of FIG. 9A.

FIG. 16A is a top-down view of the second exemplary structure after formation of cavities in crater regions by vertically recessing portions of the first upper-level dielectric material layers according to the second embodiment of the present disclosure.

FIG. 16B is a vertical cross-sectional view along the vertical plane B-B' of the second exemplary structure of FIG. 15A.

FIG. 17A is a top-down view of a second semiconductor die according to the second embodiment of the present disclosure.

FIG. 17B is a vertical cross-sectional view along the vertical plane B-B' of the second exemplary structure of FIG. 17A.

FIG. 20A is a top-down view of another alternative embodiment of the second exemplary structure after formation of a bonded assembly of the first semiconductor die and a plurality of second semiconductor dies according to the second embodiment of the present disclosure.

FIG. 20B is a vertical cross-sectional view along the vertical plane B-B' of the second exemplary structure of FIG. 20A.

DETAILED DESCRIPTION

Figure 1C:
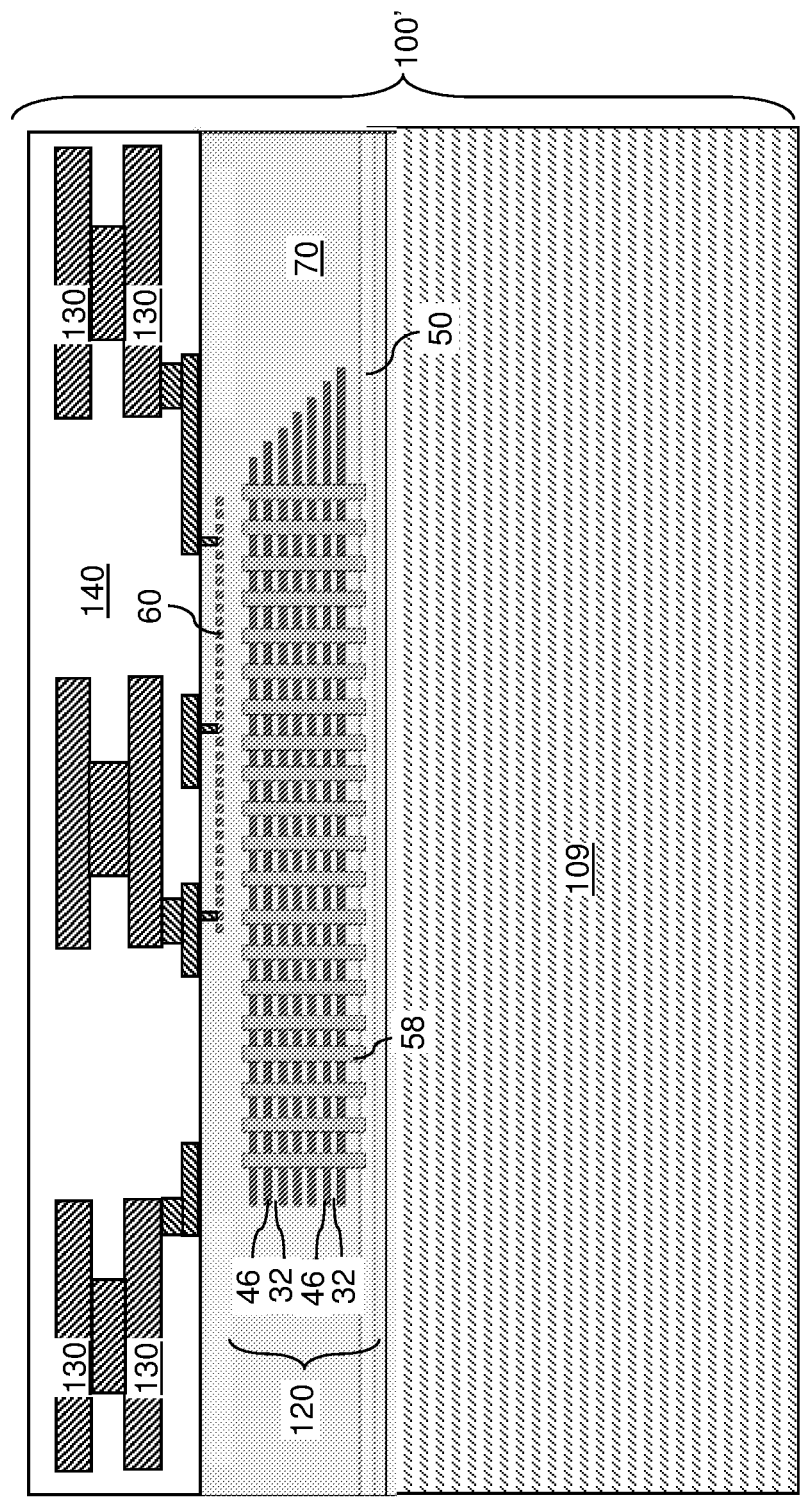

As discussed above, embodiments of the present disclosure are directed to silicon nitride stress compensating regions for reducing warpage of semiconductor die, such as a semiconductor die in a bonded assembly, and methods of making the same, the various aspects of which are described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1C, a first exemplary structure including a first semiconductor die 100' is illustrated. The first semiconductor die 100' includes a first substrate 109 including a first semiconductor material, first semiconductor devices 120 formed on a top surface of the first substrate 109, first dielectric material layers 140 formed over the first semiconductor devices 120 and embedding first metal interconnect structures 130 therein. While the present disclosure is described employing illustration of a single first semiconductor die 100', it is understood that a plurality of first semiconductor dies 100' can be simultaneously formed on a single semiconductor wafer in which the first substrate 109 laterally extends across the areas of the plurality of first semiconductor dies 100'.

The first substrate 109 may be a semiconductor substrate, and may comprise a bulk semiconductor wafer or as a semiconductor-on-insulator (SOI) wafer. For example, a commercial single crystalline bulk silicon wafer or a silicon-on-insulator substrate including a single crystalline top semiconductor layer may be employed as the first substrate 109.

The first semiconductor devices 120 may include any semiconductor device known in the art. In an illustrative example, the first semiconductor devices 120 may include a three-dimensional array of memory elements located within a three-dimensional NAND memory device or a three-dimensional NOR memory device. In this case, the first semiconductor devices 120 may include an alternating stack (32, 46) of insulating layers 32 and electrically conductive layers (e.g., word lines) 46, and a two-dimensional array of memory openings in which a respective memory opening fill structure 58 is formed. Each memory opening fill structure can include a vertical semiconductor channel that extends vertically between a source region and a drain region, and a vertical stack of memory elements provided at levels of the electrically conductive layers, which can function as word lines. A source line 50 may be provided in contact with source regions of the memory opening fill structures 58. Bit lines 60 may be electrically connected to a respective subset of drain regions of the memory opening fill structures 58. One or more dielectric layers 70 may be formed around each vertically alternating stack (32, 46) to provide electrical isolation between neighboring vertically alternating stacks (32, 46).

The first dielectric material layers 140 include interconnect-level dielectric materials such as undoped silicate glass, a doped silicate glass, organosilicate glass, a porous dielectric material, and/or dielectric metal oxides. The first dielectric material layers 140 embed first metal interconnect structures 130. The first metal interconnect structures 130 provide electrical interconnection between various nodes of the first semiconductor devices 120, and can include interconnection paths for first bonding pads to be subsequently formed. For example, the first metal interconnect structures 130 can include metal lines, metal pads, or metal via structures that are provided in the areas of first bonding pads to be subsequently formed and are vertically recessed from the topmost surface of the first dielectric material layers 140. The vertical distance between the topmost surface of the first dielectric material layers 140 and the top surface of the first substrate 109 may be in a range from 1 micron to 60 microns, such as from 2 microns to 30 microns, although lesser and greater vertical distances can also be employed.

The first semiconductor devices 120 can include stress components, which may include compressive stress or tensile stress. For example, metal plates, metal lines (e.g., word lines 46), metal wall structures, dielectric plates, and dielectric wall structures may be present in the first semiconductor devices 120. Such stress components induce local distortions due to stress (i.e., strain) which causes warpage in the first semiconductor die 100'. As a consequence, the topmost surface of the first dielectric material layers 140 can have topographical variations, i.e., local variations in height and local stretching and/or compression.

Figure 2A:
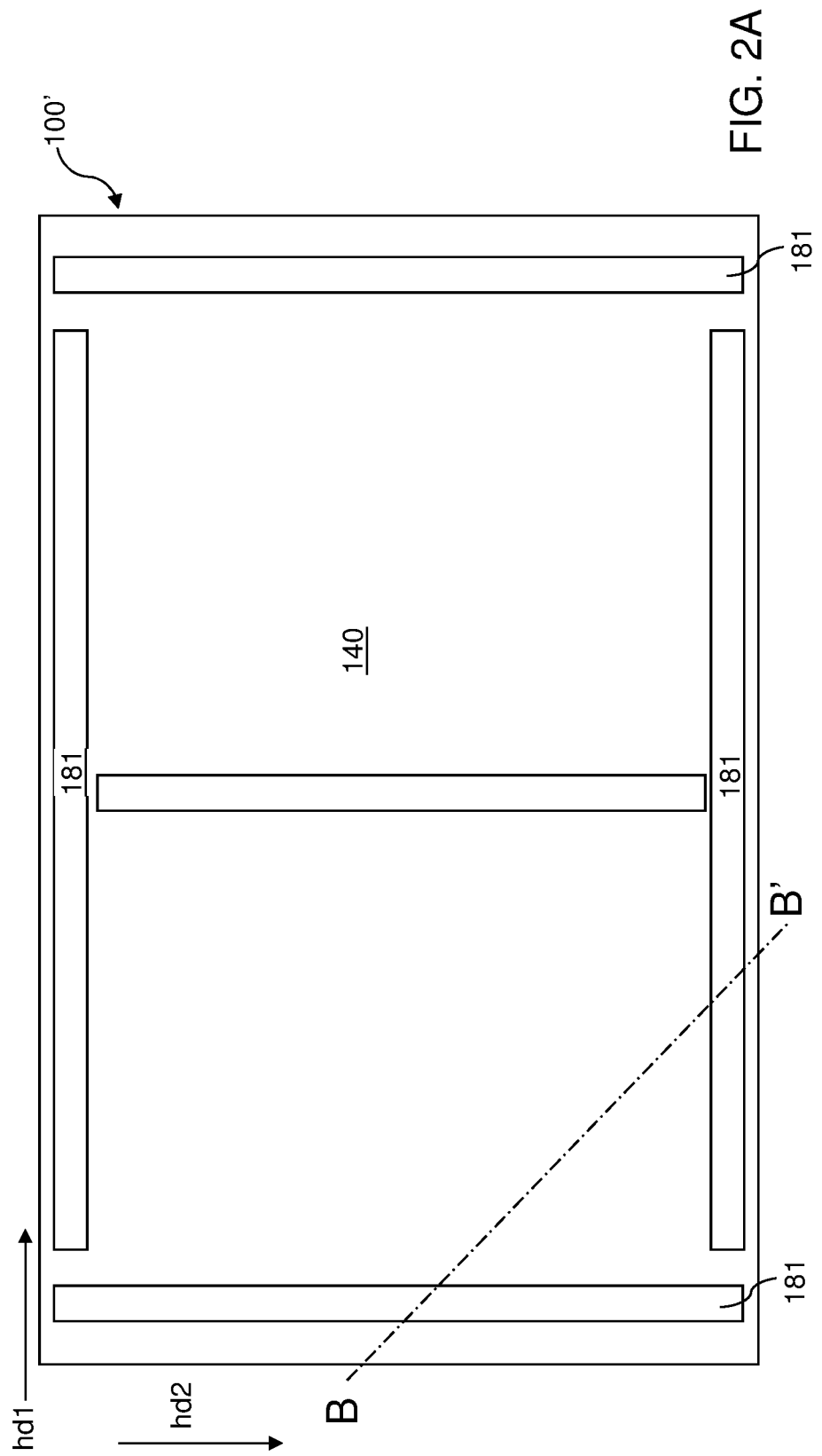
FIG. 2A is a top-down view of the first exemplary structure after formation of vertical recesses according to the first embodiment of the present disclosure.
Figure 2B:
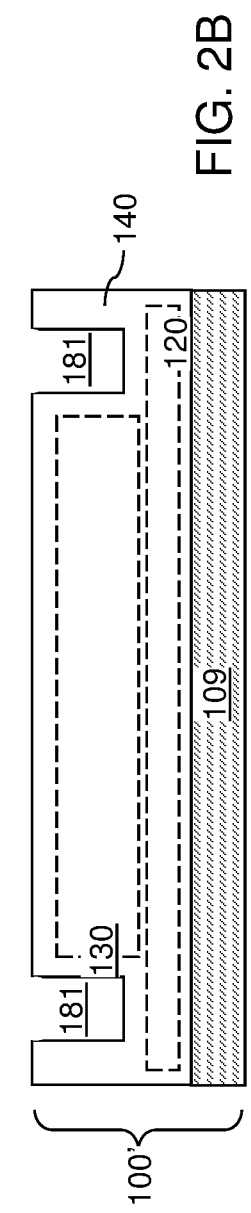
FIG. 2B is a vertical cross-sectional view along the vertical plane B-B' of the first exemplary structure of FIG. 2A.

Referring to FIGS. 2A and 2B, a photoresist layer (not shown) can be applied over the top surface of the first dielectric material layers 140. The photoresist layer can be lithographically patterned to form elongated openings. For example, if the first semiconductor die 100' has a rectangular horizontal cross-sectional shape, the lengthwise directions of the elongated openings can be parallel to a straight edge of the rectangular periphery of the first semiconductor die 100' that laterally extend along straight edges and/or in the middle of the first semiconductor die 100'. The length of each elongated opening through the photoresist layer may be in a range from 0.1% to 99.9%, such as from 1% to 99%, and/or from 5% to 90%, of the length of a straight edge of the first semiconductor die 100'. In one embodiment, at least one elongated opening through the photoresist layer can have a length that is in a range from 50% to 90% of the length of a straight edge of the first semiconductor die 100'.

According to an aspect of the present disclosure, the elongated openings in the photoresist layer may include first elongated openings that laterally extend along a first horizontal direction hd1 that is parallel to a straight edge of the first semiconductor die 100', and second elongated openings that laterally extend along a second horizontal direction hd2 that is perpendicular to the first horizontal direction hd2 and is parallel to another straight edge of the first semiconductor die 100'. Generally, the elongated openings may be arranged to define at least one bonding pad region that is free of the elongated openings. In this case, each bonding pad region can be laterally surrounded by a respective subset of the elongated openings. In one embodiment, the elongated openings may have a respective rectangular horizontal cross-sectional shape. The width of each elongated opening may be in a range from 0.5 micron to 10 microns, such as from 1 micron to 5 microns.

An etch process can be performed to transfer the pattern of the elongated openings through an upper portion of the first dielectric material layers 140. In one embodiment, an anisotropic etch process can be performed to etch unmasked portions of the first dielectric material layers 140 underneath the elongated openings in the photoresist layer. The photoresist layer can be employed as an etch mask for the anisotropic etch process. Vertical recesses are formed within each volume from which the materials of the first dielectric material layers 140 are removed. Each of the vertical recesses vertically extends from the topmost surface of the first dielectric material layers 140 toward the first substrate 109. The vertical recesses are herein referred to as line cavities 181. The line cavities 181 may have vertical or substantially vertical sidewalls, and may have a depth that is in a range from 10% to 99%, such as from 20% to 60% and/or from 30% to 50%, of the thickness of the first dielectric material layers 140. For example, the depth of the line cavities 181 may be in a range from 0.5 microns to 5 microns. In one embodiment, at least one of the line cavities 181, and/or each of the line cavities 181, may have a respective uniform vertical cross-sectional shape along vertical planes that are perpendicular to a respective lengthwise direction.

In an alternative embodiment, an isotropic etch process can be performed to etch unmasked portions of the first dielectric material layers 140 underneath the elongated openings in the photoresist layer. The photoresist layer can be employed as an etch mask for the isotropic etch process. The vertical recesses, i.e., the line cavities 181, thereby formed can have concave sidewalls with undercuts underneath the photoresist layer. In this case, the depth of each line cavity 181 may be about the same as the lateral undercut distance. Each line cavity 181 may have a depth that is in a range from 10% to 99%, such as from 20% to 60% and/or from 30% to 50%, of the thickness of the first dielectric material layers 140. For example, the depth of the line cavities 181 may be in a range from 0.5 microns to 5 microns. The photoresist layer may be subsequently removed, for example, by ashing.

Figure 3A:
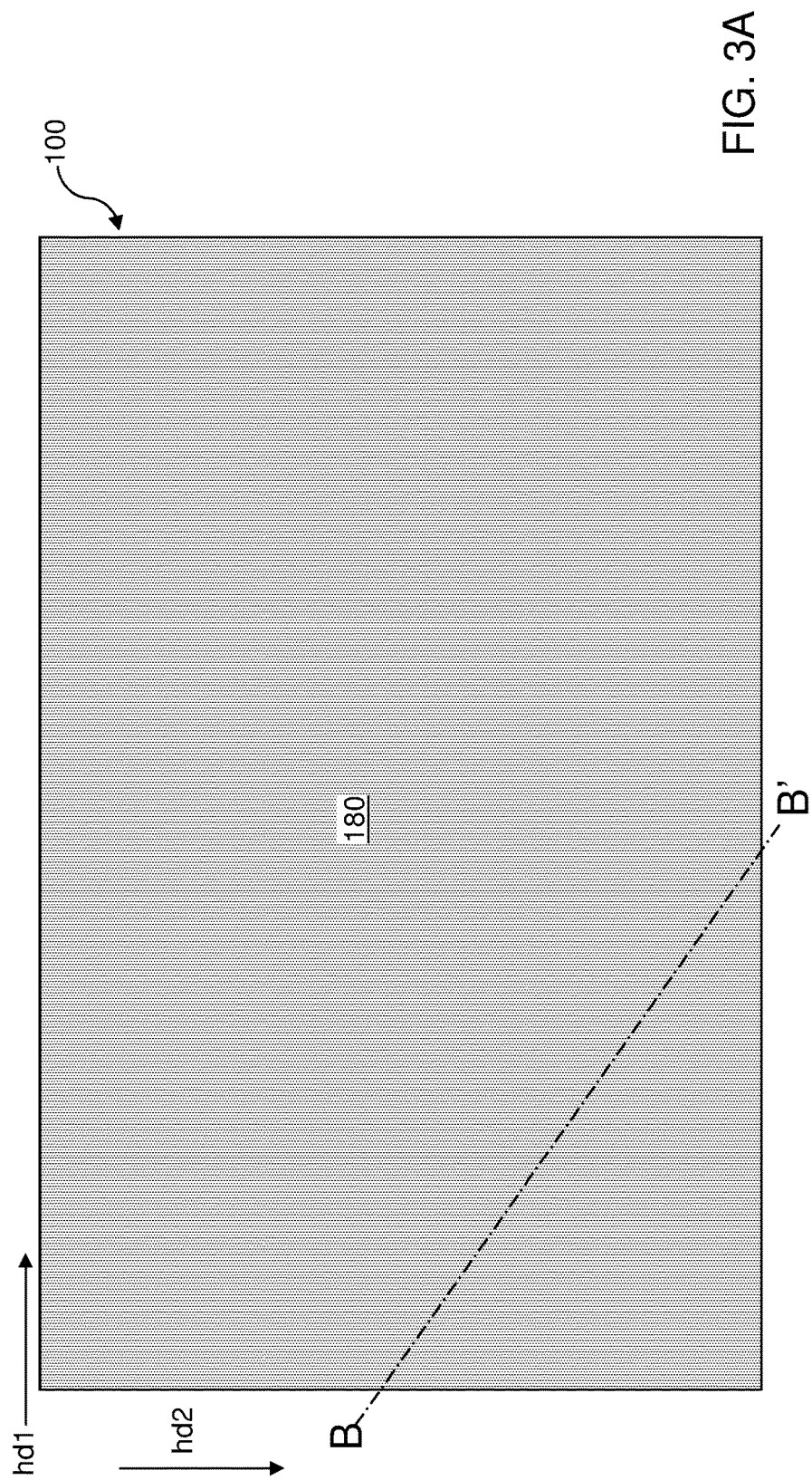
FIG. 3A is a top-down view of the first exemplary structure after formation of a compressive-stress silicon nitride material layer according to the first embodiment of the present disclosure.
Figure 3B:
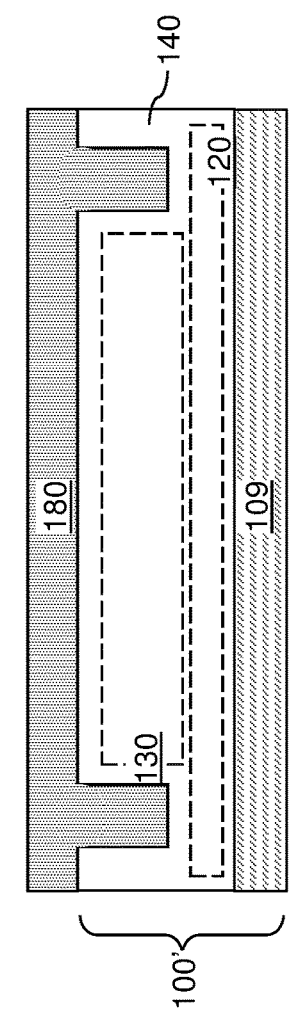
FIG. 3B is a vertical cross-sectional view along the vertical plane B-B' of the first exemplary structure of FIG. 3A.

Referring to FIGS. 3A and 3B, a compressive-stress silicon nitride material can be deposited in the line cavities 181 and over the top surface of the first dielectric material layers 140 to form a compressive-stress silicon nitride layer 180. The compressive-stress silicon nitride material can be deposited employing a plasma-enhanced chemical vapor deposition (PECVD) process at around 300° C. using silane, ammonia and hydrogen source gas mixture such that hydrogen atoms are incorporated into the deposited silicon nitride material. The hydrogen atoms incorporated in the silicon nitride material can cause the deposited silicon nitride material to be in compressive stress and apply a tensile stress to surrounding regions. A method of depositing a compressive-stress silicon nitride material is disclosed, for example, in Hasegawa et al., *Effects of active hydrogen on the stress relaxation of amorphous $SiN_x$:H films*, J. Appl. Phys. 75, 1493 (1994), the entire contents of which is incorporated herein by reference. The ratio of silicon atoms to nitrogen atoms in such a compressive-stress silicon nitride material about 3:4. In other words, the compressive-stress silicon nitride material can be stoichiometric other than incorporation of hydrogen atoms. The level of tensile stress that the compressive-stress silicon nitride material can apply to neighboring material portions may be in a range from 0.5 GPa to 3.0 GPa. The thickness of the deposited compressive-stress silicon nitride material can be selected to fill the entire volume of each line cavity 181. As such, the thickness of a horizontally-extending portion of the compressive-stress silicon nitride layer 180 can be in a range from 0.5 micron to 5 microns, such as from 1 micron to 2.5 microns, although lesser and greater thicknesses can also be employed.

Figure 4A:
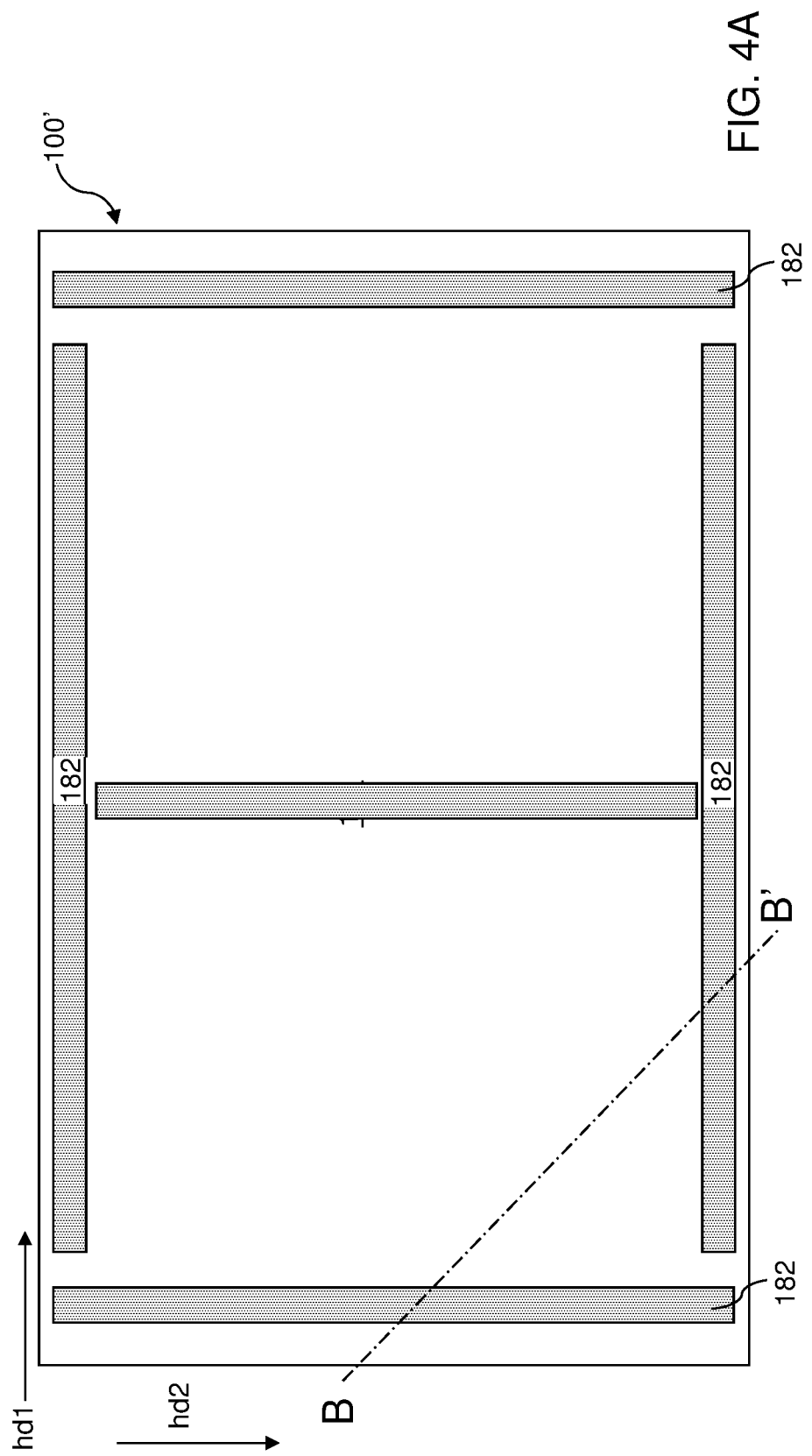
FIG. 4A is a top-down view of the first exemplary structure after formation of compressive-stress silicon nitride material strips according to the first embodiment of the present disclosure.
Figure 4B:
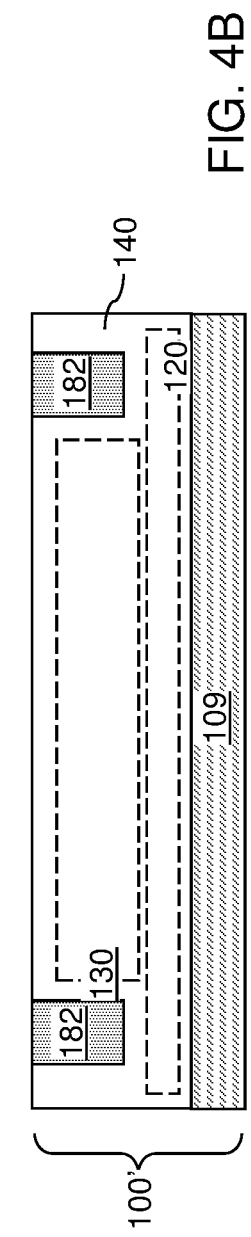
FIG. 4B is a vertical cross-sectional view along the vertical plane B-B' of the first exemplary structure of FIG. 4A.

Referring to FIGS. 4A and 4B, the horizontally-extending portion of the compressive-stress silicon nitride layer 180 that overlies the top surface of the first dielectric material layers 140 can be removed without removing the portions of the compressive-stress silicon nitride layer 180 that fill the line cavities 181. For example, an isotropic etch process such as a wet etch process employing hot phosphoric acid can be performed to etch back the horizontally-extending portion of the compressive-stress silicon nitride layer 180 that overlie the horizontal plane including the top surface of the first dielectric material layers 140. Alternatively or additionally, a chemical mechanical planarization process may be employed to remove all, or a portion, of the horizontally-extending portion of the compressive-stress silicon nitride layer 180 that overlies the horizontal plane including the top surface of the first dielectric material layers 140.

Each remaining portion of the compressive-stress silicon nitride layer 180 that fills a respective one of the line cavities 181 constitutes a compressive-stress silicon nitride material strip 182. Each compressive-stress silicon nitride material strip 182 can laterally extend along a respective lengthwise direction, which may be the first horizontal direction hd1 or the second horizontal direction hd2. Each compressive-stress silicon nitride material strip 182 is a silicon nitride material portion that includes a silicon nitride material applying tensile stress to respective neighboring material portions. In case a chemical mechanical planarization process is employed to remove portions of the compressive-stress silicon nitride layer 180 that overlie the horizontal plane including the top surface of the first dielectric material layers 140, the top surfaces of the compressive-stress silicon nitride material strips 182 may be located within the horizontal plane including the top surface of the first dielectric material layers 140.

Local distortions (i.e., local strain) or local stress in the first semiconductor die 100' may be known or measured. For example, the local strain or stress may be calculated or determined experimentally from an identical test die and then stored in a database. Alternatively, the local strain may be measured, for example, by measuring lateral distances between pairs of markers (not shown) that are present in, or on, the first dielectric material layers or a subset of first metal interconnect structures that are embedded in the first dielectric material layers 140. In one embodiment, markers may include alignment marks or overlay measurement marks. In this case, the local strain (i.e., distortions) in the first semiconductor die may be determined by comparing the measured distances between the pairs of markers or between pairs of first metal interconnect structures with nominal distances based on the design layout of the first semiconductor die 100'.

In one embodiment, the first semiconductor die 100' may be in tensile stress along one horizontal direction (e.g., word line or bit line direction), and compressive stress along a perpendicular horizontal direction (e.g., bit line or word line direction). Without adding silicon nitride counter-stress regions, these opposite stresses may cause the first semiconductor die 100' to warp into a saddle shape in which first and second parallel edges of the first semiconductor die 100' curve upwards along the word line direction and in which third and fourth parallel edges (which are orthogonal to the first and second edges) curve downwards along the bit line direction.

Figure 5A:
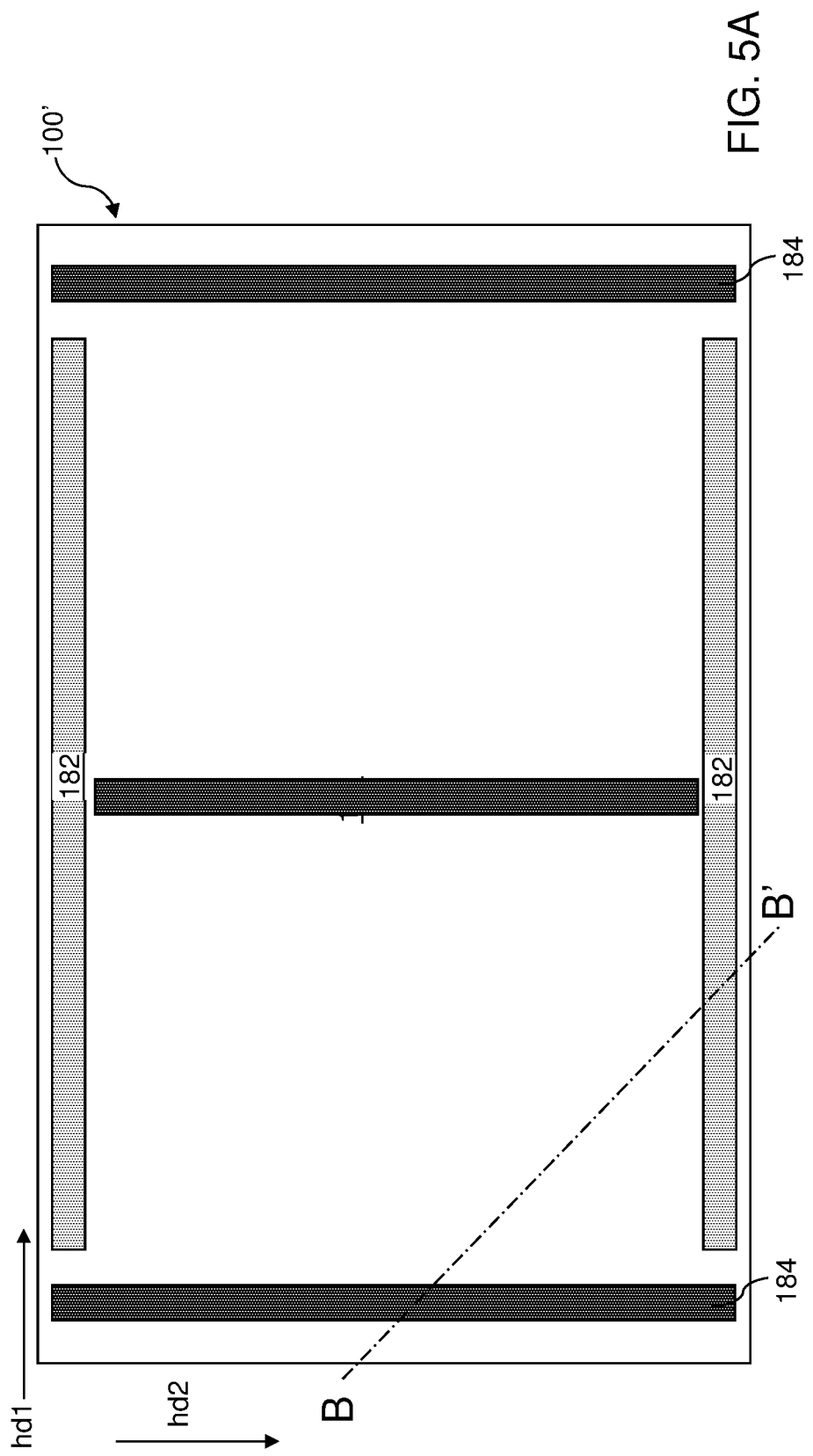
FIG. 5A is a top-down view of the first exemplary structure after conversion of a subset of the compressive-stress silicon nitride material strips into tensile-stress silicon nitride material strips according to the first embodiment of the present disclosure.
Figure 5B:
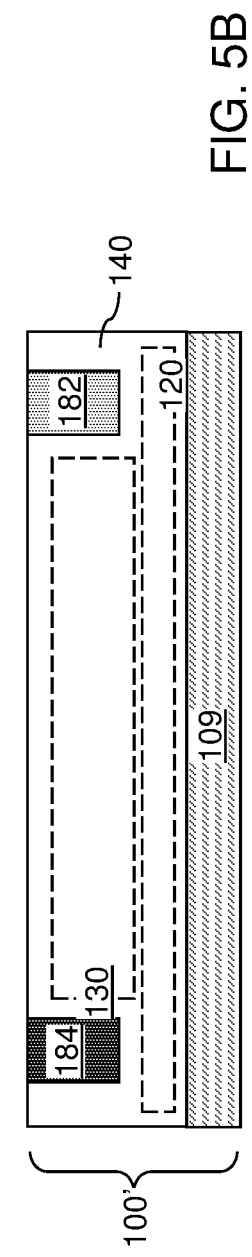
FIG. 5B is a vertical cross-sectional view along the vertical plane B-B' of the first exemplary structure of FIG. 5A.

Referring to FIGS. 5A and 5B, first silicon nitride counter-stress regions which are under compressive stress are located in the first regions of the first semiconductor die 100' that are under tensile stress, to reduce or prevent compressive strain in the first regions. Second silicon nitride counter-stress regions which are under tensile stress are located in the second regions of the first semiconductor die 100' that are under compressive stress, to reduce or prevent tensile strain in the second regions. First silicon nitride counter-stress regions may comprise the compressive-stress silicon nitride material strips 182 and the second silicon nitride counter-stress regions may comprise tensile-stress silicon nitride material strips 184.

The tensile-stress silicon nitride material strips 184 may be formed by laser annealing a subset of the compressive-stress silicon nitride material strips 182 to outgas hydrogen from these strips. The reduction in hydrogen concentration converts the compressive-stress silicon nitride material strips 182 into the tensile-stress silicon nitride material strips 184. After the laser annealing the remaining compressive-stress silicon nitride material strips 182 that are not irradiated with a laser beam are referred to herein as first silicon nitride material strips 182 that apply a tensile stress to respective surrounding material portions of the first semiconductor die 100'. The tensile-stress silicon nitride material strips 184 are referred to herein as second silicon nitride material strips 184 that apply a compressive stress to respective surrounding material portions of the first semiconductor die 100'.

The subset of the compressive-stress silicon nitride material strips 182 to be converted into the second silicon nitride material strips 184 by laser irradiation may be selected for each first semiconductor die 100' based on measured local strain or based on the local stress or strain that is stored in a database. In one embodiment, the first silicon nitride material strips 182 may extend orthogonally to the second silicon nitride material strips 184 if the regions of opposite stress type in the first semiconductor die 100' are orthogonal to each other. The first silicon nitride material strips 182 may extend parallel to each other along first and second parallel edges of the first semiconductor die 100'. The second silicon nitride material strips 184 may extend parallel to each other along third and firth parallel edges of the first semiconductor die 100'. Optionally one or more of the first or second silicon nitride material strips may also be located in a middle portion of the first semiconductor die 100', as shown in FIG. 5A. The third and fourth edges of the first semiconductor die 100' may be orthogonal to the first and second edges. The second silicon nitride material strips 184 may be orthogonal to the first silicon nitride material strips 182.

The peak temperature of a compressive-stress silicon nitride material strip 182 during laser irradiation can be in a range from 600 degrees Celsius to 1,100 degrees Celsius. The intensity and the duration of the laser beam can be selected to provide a target anneal temperature in each irradiated region to outgas a sufficient amount of hydrogen to convert the stress state of the silicon nitride from compressive to tensile. In one embodiment, the absolute magnitude of the tensile stress in the second silicon nitride material strips 184 after the laser irradiation process can be in a range from 0.1 GPa to 0.6 GPa, and the absolute magnitude of the compressive stress in the first silicon nitride material strips 182 can be in a range from 1 GPa to 3 GPa.

Figure 6A:
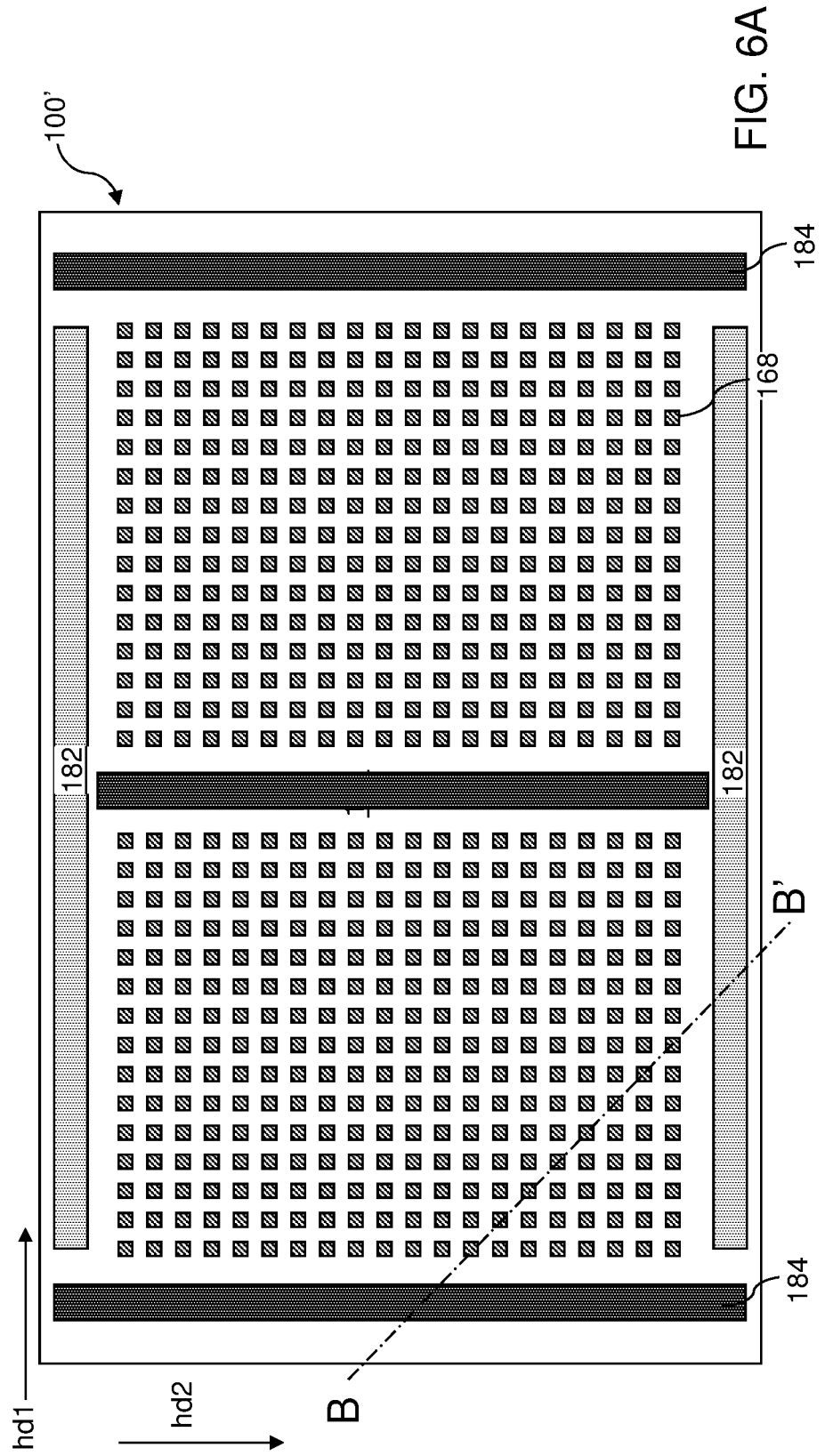
FIG. 6A is a top-down view of the first exemplary structure after formation of first bonding pads according to the first embodiment of the present disclosure.
Figure 6B:
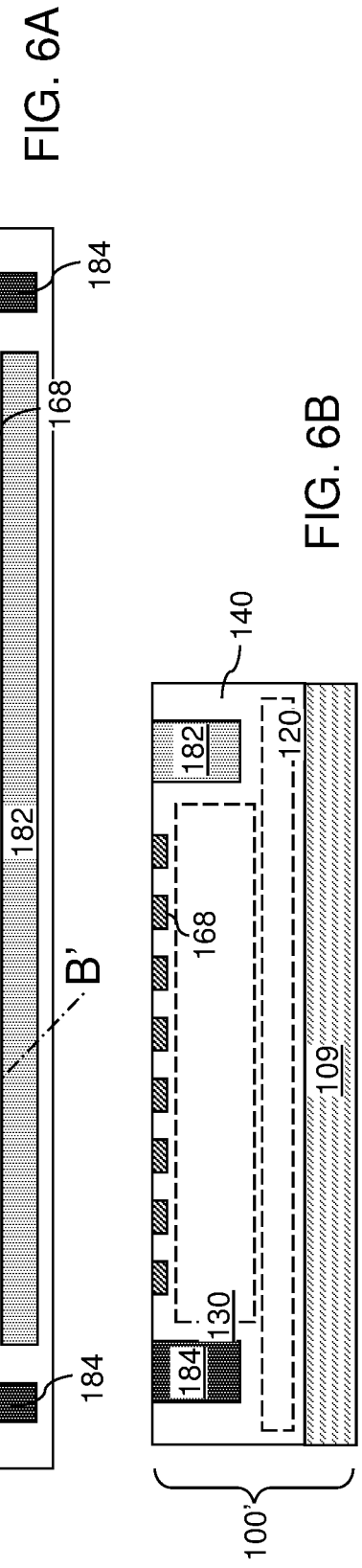
FIG. 6B is a vertical cross-sectional view along the vertical plane B-B' of the first exemplary structure of FIG. 6A.

Referring to FIGS. 6A and 6B, a photoresist layer (not shown) can be applied over the first dielectric material layers 140, the first silicon nitride material strips 182, and the second silicon nitride material strips 184, and can be lithographically patterned to form an array of openings. Each opening can have a circular shape, a polygonal shape or a shape of a rounded polygon, i.e., a shape of a polygon that is modified to replace angular corners with rounded corners. An anisotropic etch process can be performed to transfer the pattern of the array of openings through an upper portion of the first dielectric material layers 140. An array of pad cavities can be formed in regions that are not masked by the photoresist layer. A top surface of an underlying metal interconnect structure (such as a metal pad, a metal line, or a metal via structure) can be physically exposed at the bottom of each pad cavity. The photoresist layer can be subsequently removed, for example, by ashing.

At least one metallic material can be deposited in the array of pad cavities. The at least one metallic material can include, for example, a metallic nitride material such as TiN, TaN, or WN, and a metallic fill material such as Cu or a copper-containing alloy. Excess portions of the at least one metallic material can be removed from above the horizontal plane including the top surface of the first dielectric material layers 140 by a planarization process. For example, a chemical mechanical planarization process can be employed to remove the portions of the at least one metallic material that overlie the horizontal plane including the top surface of the first dielectric material layers 140. The remaining portions of the at least one metallic material that fill the array of pad cavities constitute first bonding pads 168.

The first bonding pads 168 are formed in the first dielectric material layers 140. Top surfaces of the first bonding pads 168 can be formed within the horizontal plane including the topmost surface of the first dielectric material layers 140. The first bonding pads 168 can be formed in regions in which the silicon nitride material strips (182, 184) are not present. The first bonding pads 168 are formed after locally annealing a subset of the compressive-stress silicon nitride material strips 182 with the laser irradiation as provided at the processing steps of FIGS. 5A and 5B.

In one embodiment, at least one of the silicon nitride material strips (182, 184) can have a lateral dimension that is greater than a maximum lateral dimension of each of the first bonding pads 168, and can have a depth that is greater than the vertical thickness of the first bonding pads 168. For example, at least one, and/or each, of the silicon nitride material strips (182, 184) can have a lateral dimension that is greater than 100 microns, and the maximum lateral dimension of each first bonding pad 168 can be less than 100 microns. In one embodiment, the first bonding pads 168 can have a first pitch along the first horizontal direction hd1 and a second pitch along the second horizontal direction hd2, and at least one, and/or each, of the silicon nitride material strips (182, 184) can have a lateral dimension that is greater than the first pitch and is greater than the second pitch. Further, at least one, and/or each, of the silicon nitride material strips (182, 184) can have a vertical thickness in a range from 0.5 microns to 5 microns, and the first bonding pads 168 can have a thickness that is less than the vertical thickness of the silicon nitride material strips (182, 184). For example, the thickness of the first bonding pads 168 can be in a range from 0.3 microns to 3 microns.

Generally, the first silicon nitride material strips 182 and the second silicon nitride material strips 184 can be positioned in any manner that reduces the overall strain and the deformation of the first semiconductor die 100'. In some cases, aligning the lengthwise directions of the first silicon nitride material strips 182 along one horizontal direction and aligning the lengthwise directions of the second silicon nitride material strips 184 along another horizontal direction may be advantageous in reducing the overall deformation of the first semiconductor die 100'. Such cases can occur if major stress components of the first semiconductor devices 120 (such as the word lines 46) are arranged along a same horizontal direction. In one embodiment, the first silicon nitride material strips 182 can laterally extend along a first lengthwise direction (such as the first horizontal direction hd1), and the second silicon nitride material strips 184 can laterally extend along a second lengthwise direction (such as the second horizontal direction hd2) that is different from (e.g., perpendicular to) the first lengthwise direction.

Generally, the first bonding pads 168 can be embedded in the upper portion of the first dielectric material layers 140. Reduction of the deformation of the first semiconductor die 100' at the processing steps of FIGS. 5A and 5B provides a more planar topmost surface of the first dielectric material layers 140, and thus, provides formation of the first bonding pads 168 with higher planarity in the upper portion of the first dielectric material layers 140. The top surfaces of the first bonding pads 168 are located in the horizontal plane including the top surface of the first dielectric material layers 140. The top surfaces of the first silicon nitride material strips 182 and top surfaces of the second silicon nitride material strips 184 can be within the horizontal plane that includes the top surface of the first dielectric material layers 140.

Figure 7A:
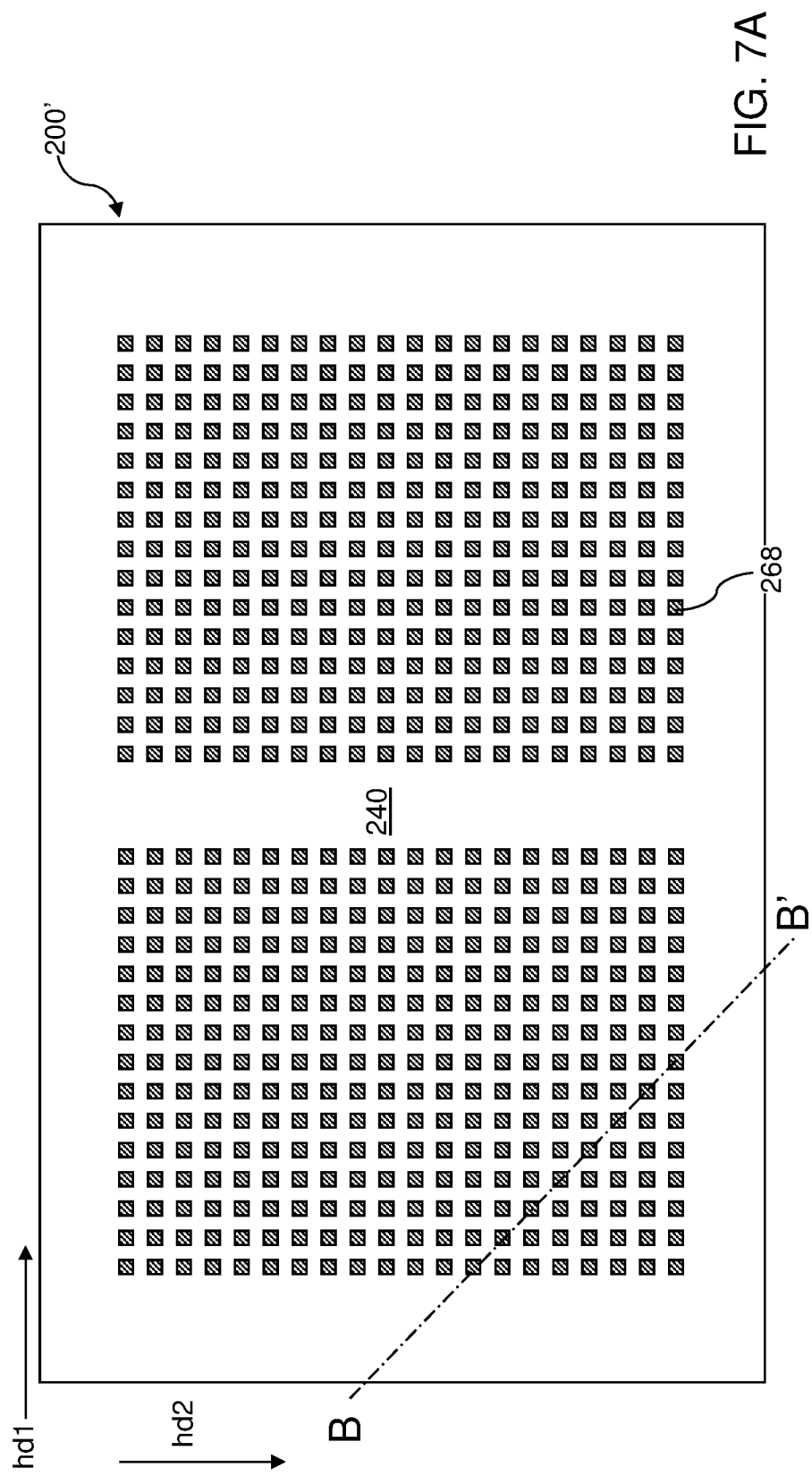
FIG. 7A is a top-down view of a second semiconductor die according to the first embodiment of the present disclosure.
Figure 7B:
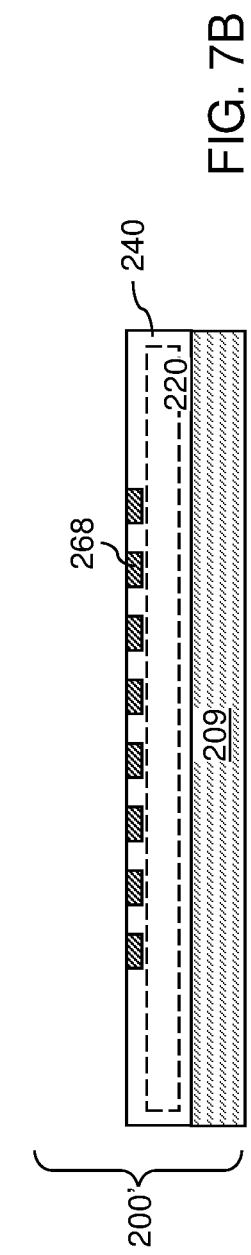
FIGS. 7B and 7C are different magnifications of vertical cross-sectional views along the vertical plane B-B' of the second semiconductor die structure of FIG. 7A.
Figure 7C:
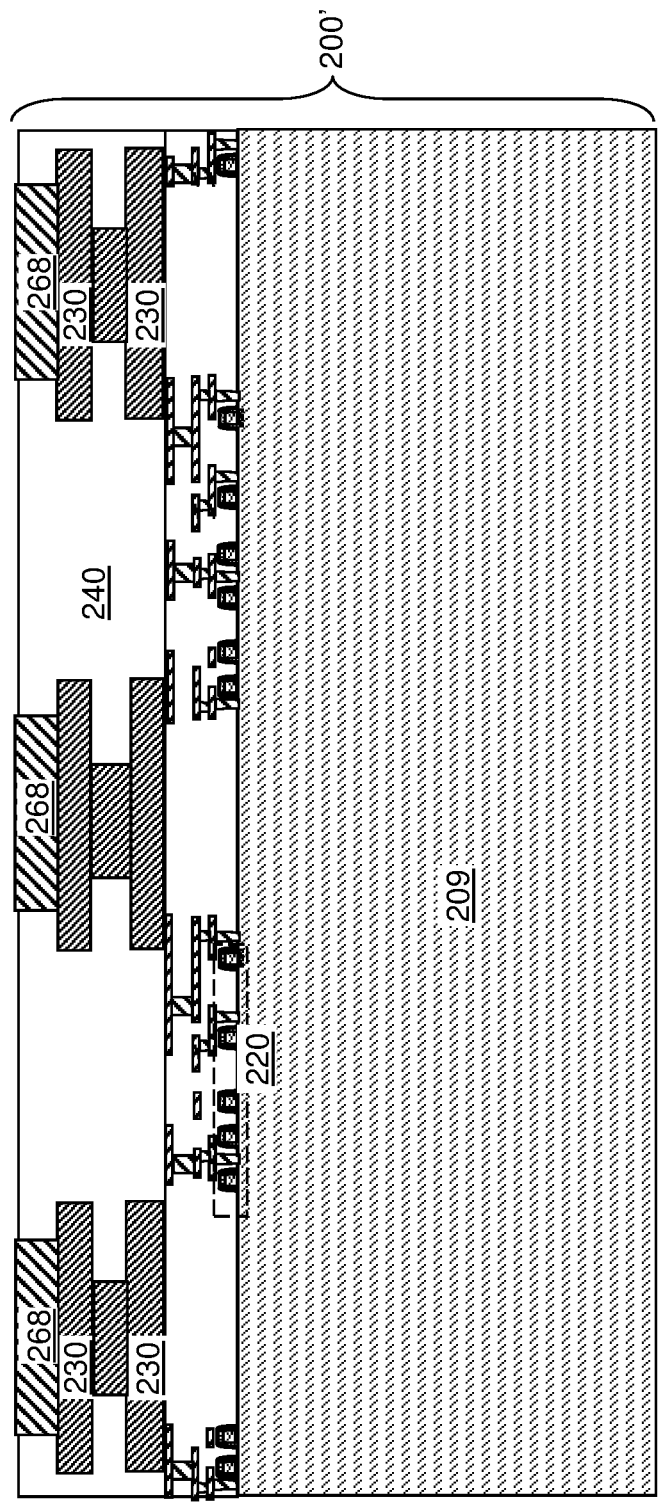

Referring to FIGS. 7A-7C, a second semiconductor die 200' is illustrated, which is configured to be bonded to the first semiconductor die 100'. The second semiconductor die 200' includes a second substrate 209, second semiconductor devices 220 located on the second substrate 209, second dielectric material layers 240 located on the second semiconductor devices 220 and embedding second metal interconnect structures 230 (shown in FIG. 7C), and second bonding pads 268 embedded in the second dielectric material layer 240. The top surfaces of the second bonding pads 268 can be physically exposed within the horizontal plane including the top surface of the second dielectric material layers 240. The pattern of the second bonding pads 268 can be a mirror image pattern of the pattern of the first bonding pads 168 of the first semiconductor die 100'. The materials of the second substrate 209, the second dielectric material layers 240, the second metal interconnect structures 230 and the second bonding pads 268 may be the same the materials of the respective first substrate 109, first dielectric material layers 140, first metal interconnect structures 130 and first bonding pads 168.

In one embodiment, the first semiconductor devices 120 in the first semiconductor die 100' can include a three-dimensional array of memory elements, and the second semiconductor devices 220 in the second semiconductor die 200' can include a peripheral (e.g., driver) circuit configured to control the operation of the three-dimensional array of memory elements in the first semiconductor die 100'. The second semiconductor devices 220 may comprise field effect transistors in a CMOS configuration. Generally, the first semiconductor devices 120 and the second semiconductor devices 220 may be selected to provide complementary functionalities so that a bonded assembly of the first semiconductor die 100' and the second semiconductor die 200' provides enhanced functionality or full functionality that the first semiconductor die 100' alone, or the second semiconductor die 200' alone, does not provide.

Figure 8A:
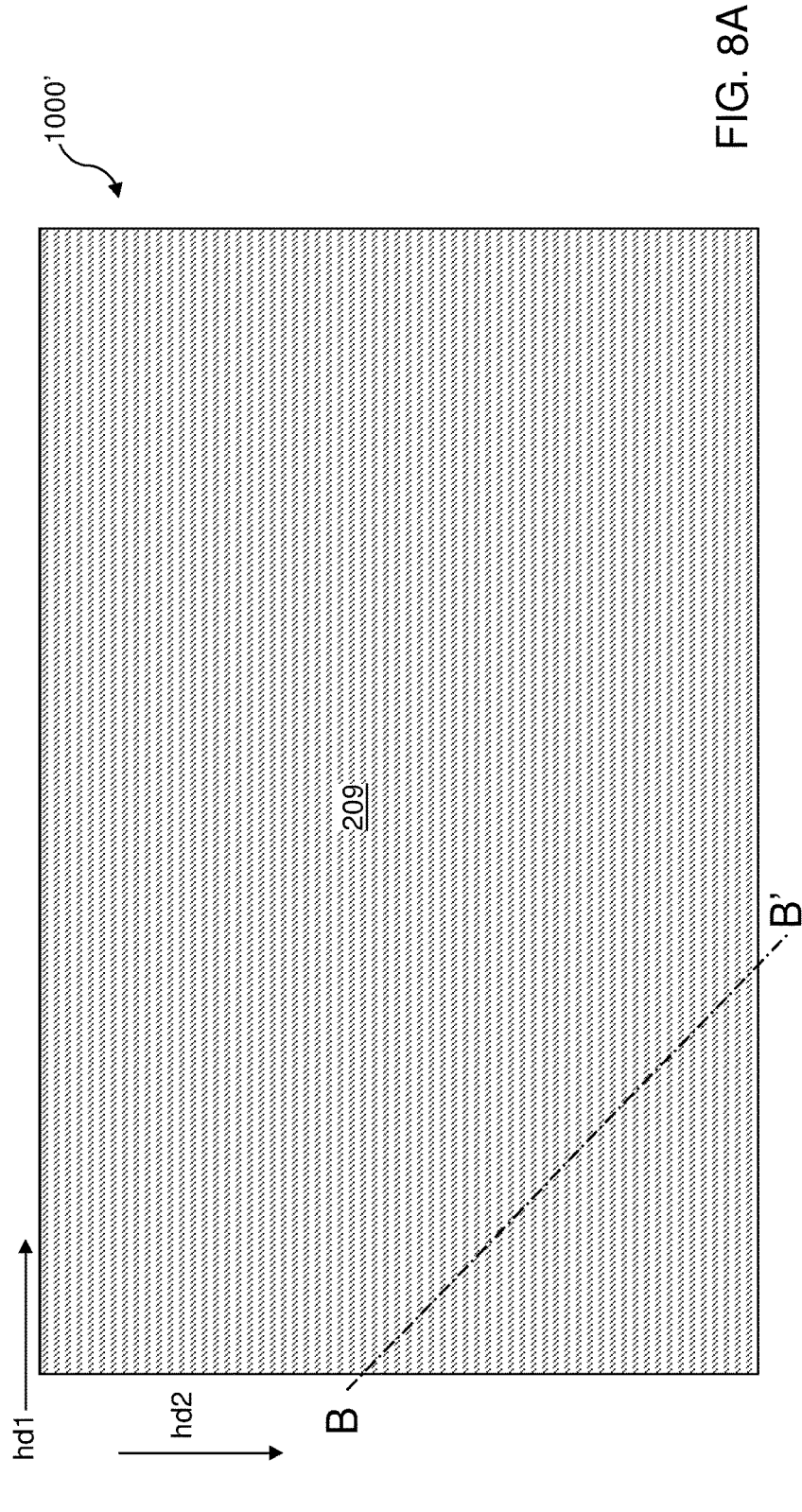
FIG. 8A is a top-down view of the first exemplary structure after formation of a bonded assembly of the first semiconductor die and the second semiconductor die according to the first embodiment of the present disclosure.
Figure 8B:
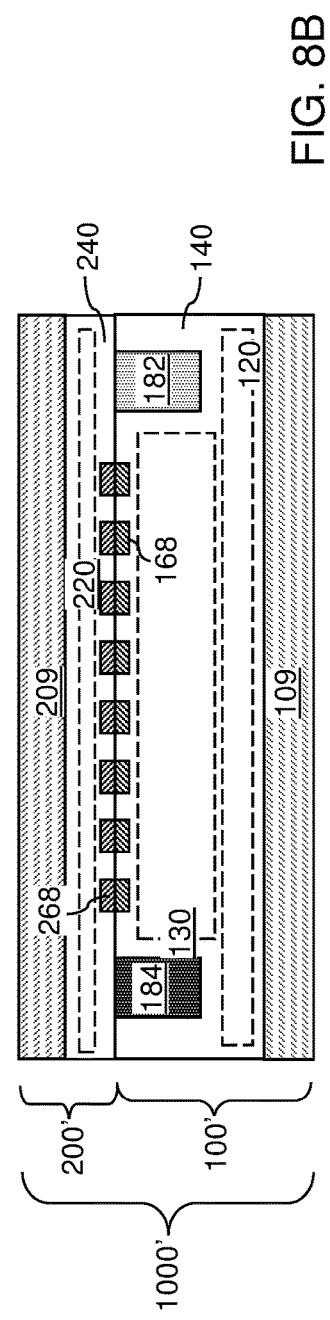
FIG. 8B is a vertical cross-sectional view along the vertical plane B-B' of the first exemplary structure of FIG. 8A.

Referring to FIGS. 8A and 8B, the second semiconductor die 200' can be disposed to face the first semiconductor die 100' such that each second bonding pad 268 faces a respective one of the first bonding pads 168. A metal-to-metal bonding between each mating pair of a first bonding pad 168 and a second bonding pad 268 can be induced to bond the first bonding pads 168 to the second bonding pads 268. For example, an anneal process can be performed in a temperature range from 200 degrees Celsius to 400 degrees Celsius. Optionally, dielectric-to-dielectric bonding such as oxide-to-oxide bonding can be induced between the first dielectric material layers 140 and the second dielectric material layers 240. In this case, the anneal temperature may be in a range from 250 degrees Celsius to 500 degrees Celsius. A bonded assembly 1000' of the first semiconductor die 100' and the second semiconductor die 200' can be formed. Warpage and distortion of the first semiconductor die 100' can be reduced at the processing steps of FIGS. 5A and 5B through local adjustment of stress by selective conversion of a subset of the compressive-stress silicon nitride material strips 182 into tensile-stress silicon nitride material strips 184.

Particularly, the local stress adjustment process can be effective if the first semiconductor devices 120 include a tall structure having a height greater than 5 microns, such as a three-dimensional array of memory elements. Vertical and lateral displacement of the first bonding pads 168 from ideal positions can be reduced through the local stress adjustment process of FIGS. 5A and 5B, and the first bonding pads 168 can be provided with enhanced periodicity and regularity. Thus, aligned bonding between the first bonding pads 168 and the second bonding pads 268 can be facilitated, and the bonded assembly 1000' can have solid bonding structures between the mating pairs of a first bonding pad 168 and a second bonding pad 268. While plural first and second dielectric material layers (140, 240) are described above, it should be noted that a single dielectric material layer 140 and a single second dielectric material layer 240 may be used instead.

Referring to FIGS. 9A and 9B, a second exemplary structure including a first semiconductor die 100 is illustrated according to a second embodiment of the present disclosure. The first semiconductor die 100 of the second embodiment can be derived from the first semiconductor die 100' of the first embodiment by forming only a set of one or more lower layers of the first dielectric material layers 140. The lower subset of the first dielectric material layers 140 comprise first lower-level dielectric material layers 140A, which are a set of lower-level dielectric material layers within the first dielectric material layers 140. The first lower-level dielectric material layers 140A embed a subset of the first metal interconnect structures 130 of FIGS. 1A and 1B that is located within the set of lower-level dielectric material layers within the first dielectric material layers 140. In other words, only a lower subset of the first dielectric material layers 140 and a subset of the first metal interconnect structures 130 located below a horizontal plane passing through a middle region of the first dielectric material layers 140 of FIGS. 1B and 1C is formed at the processing steps of FIGS. 9A and 9B of the second embodiment.

For example, at least one array of metal interconnect structures 130 shown in FIGS. 1B and 1C (such as metal pads, metal lines, or metal via structures) can be formed within the first lower-level dielectric material layers 140A.

In one embodiment, a plurality of arrays of metal interconnect structures can be formed within the first lower-level dielectric material layers 140A.

A photoresist layer can be applied over the top surface of the first lower-level dielectric material layers 140A, and can be lithographically patterned to form at least one array of openings therethrough. Each of the openings through the photoresist layer can be formed over a respective one of the underlying metal interconnect structures 130 embedded in the first lower-level dielectric material layers 140A. An anisotropic etch process can be performed to transfer the pattern of the openings in the photoresist layer through an upper portion of the first lower-level dielectric material layers 140A. At least one array of pad cavities are formed in the upper portion of the first lower-level dielectric material layers 140A. The photoresist layer can be removed, for example, by ashing.

At least one metallic material can be deposited in the array of pad cavities. The at least one metallic material can include, for example, a metallic nitride material such as TiN, TaN, or WN, and a metallic fill material such as Cu or a copper-containing alloy. Excess portions of the at least one metallic material can be removed from above the horizontal plane including the top surface of the first lower-level dielectric material layers 140A by a planarization process. For example, a chemical mechanical planarization process can be employed to remove the portions of the at least one metallic material that overlie the horizontal plane including the top surface of the first lower-level dielectric material layers 140A. The remaining portions of the at least one metallic material that fill the array of pad cavities constitute lower-level bonding pads 166. Each of the lower-level bonding pads 166 can contact a respective metal interconnect structure 130 embedded in the first lower-level dielectric material layers 140A, and may be electrically connected to a respective node of the first semiconductor devices 120, or to a respective metal interconnect structure that will be subsequently connected to a respective set of additional metal interconnect structures to be subsequently formed.

Figure 10A:
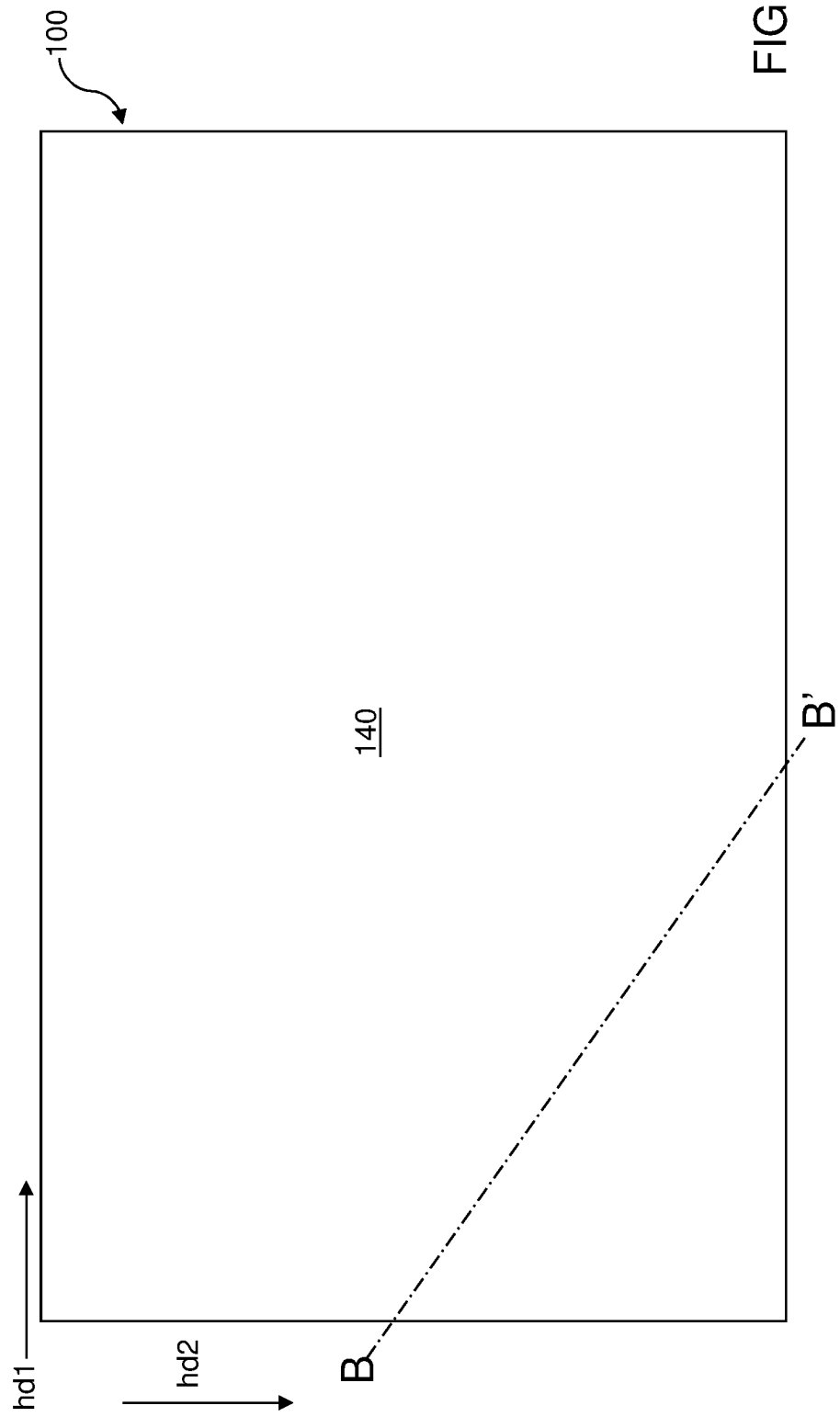
FIG. 10A is a top-down view of the second exemplary structure after formation of first upper-level dielectric material layers according to a second embodiment of the present disclosure.
Figure 10B:
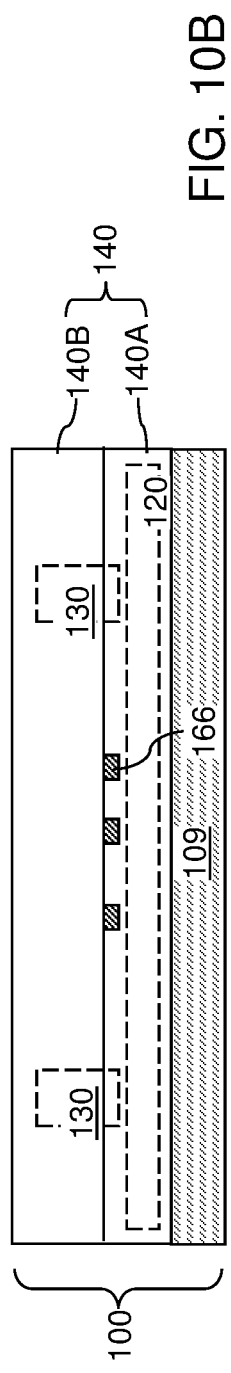
FIG. 10B is a vertical cross-sectional view along the vertical plane B-B' of the second exemplary structure of FIG. 10A.

Referring to FIGS. 10A and 10B, additional dielectric material layers can be formed over the first lower-level dielectric material layers 140A. The additional dielectric material layers are herein referred to as first upper-level dielectric material layers 140B. The combination of the first lower-level dielectric material layers 140A and the first upper-level dielectric material layers 140B constitute first dielectric material layers 140. The first upper-level dielectric material layers 140B can embed the remaining first metal interconnect structures 130 in regions that do not overlie the lower-level bonding pads 166. The lower-level bonding pads 166 are covered with the first upper-level dielectric material layers 140B, and become buried bonding pads.

Figure 11A:
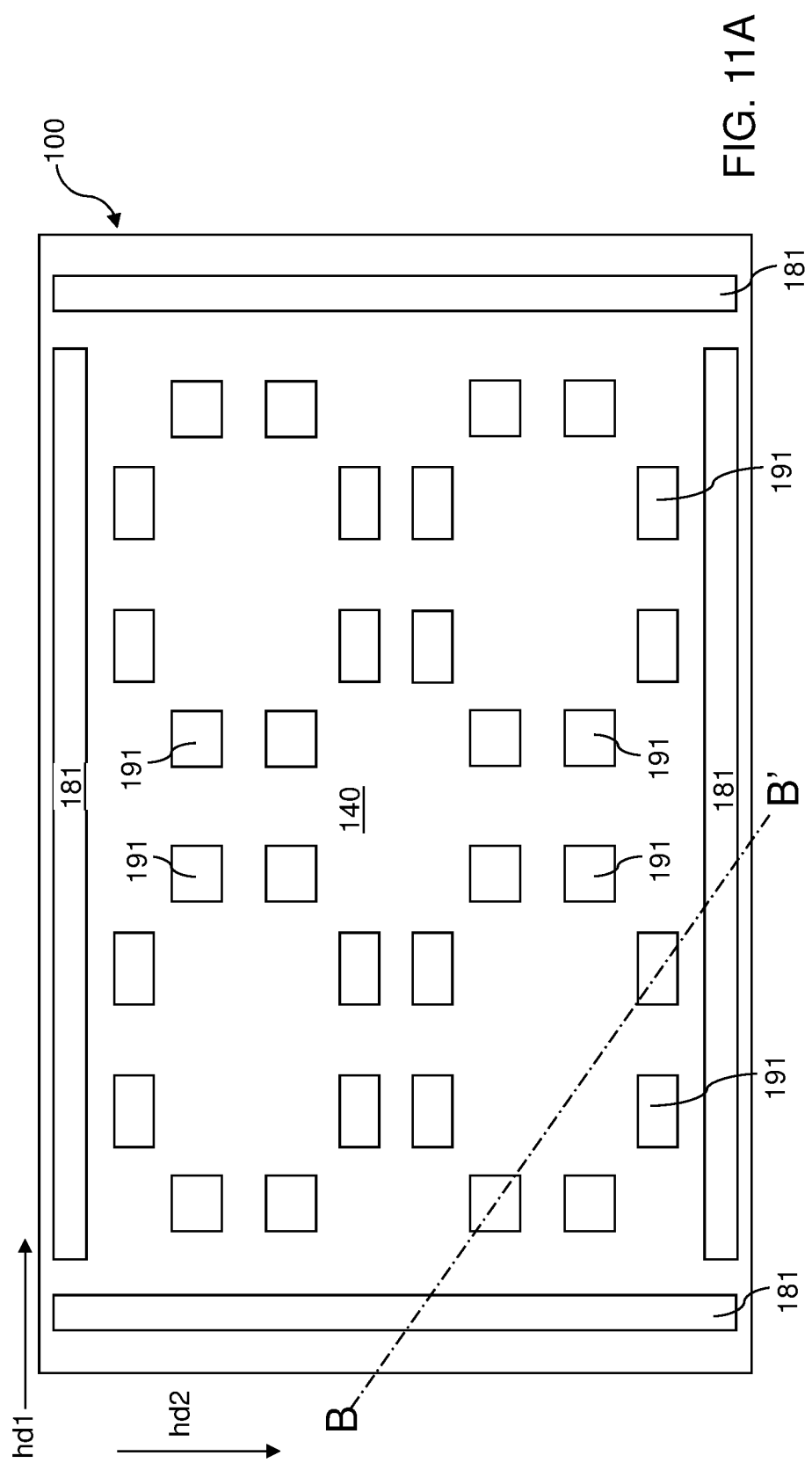
FIG. 11A is a top-down view of the second exemplary structure after formation of vertical recesses according to the second embodiment of the present disclosure.
Figure 11B:
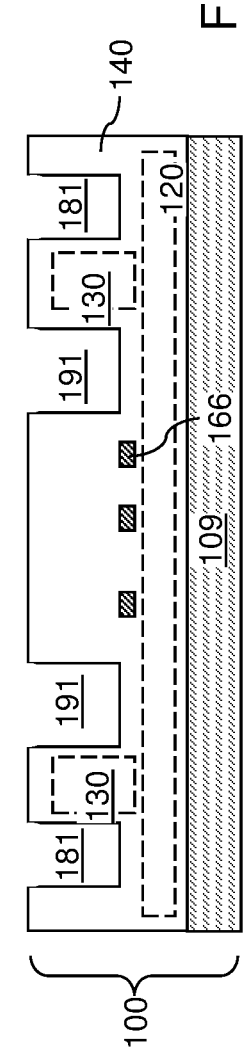
FIG. 11B is a vertical cross-sectional view along the vertical plane B-B' of the second exemplary structure of FIG. 11A.

Referring to FIGS. 11A and 11B, a photoresist layer (not shown) can be applied over the top surface of the first dielectric material layers 140. The photoresist layer can be lithographically patterned to form elongated openings that laterally extend along straight edges of the first semiconductor die 100 and to form localized openings. For example, if the first semiconductor die 100 has a rectangular horizontal cross-sectional shape, the lengthwise directions of the elongated openings can be parallel to a straight edge of the rectangular periphery of the first semiconductor die 100. The length of each elongated opening through the photoresist layer may be in a range from 0.1% to 99.9%, such as from 1% to 99%, and/or from 5% to 90%, of the length of a straight edge of the first semiconductor die 100. In one embodiment, at least one elongated opening through the photoresist layer can have a length that is in a range from 50% to 90% of the length of a straight edge of the first semiconductor die 100. The horizontal cross-sectional shape of each localized opening may be a polygonal shape, a circular shape, an oval shape, or a shape of any two-dimensional curvilinear shape having a closed periphery. In one embodiment, at least a subset of the localized openings can have a rectangular horizontal cross-sectional shape. The localized openings can have a maximum lateral dimension that is less than 10%, such as less than 5%, for example 0.1% to 3% of the maximum lateral dimension of the first semiconductor die 100. The elongated openings and the localized openings in the photoresist layer are formed in areas that do not overlie the lower-level bonding pads 166.

According to an aspect of the present disclosure, the elongated openings in the photoresist layer may include first elongated openings that laterally extend along a first horizontal direction hd1 that is parallel to a straight edge of the first semiconductor die 100, and second elongated openings that laterally extend along a second horizontal direction hd2 that is perpendicular to the first horizontal direction hd2 and is parallel to another straight edge of the first semiconductor die 100. In one embodiment, the localized openings can include rectangular openings having a length-to-width ratio in a range from 1:1 to 3:1. Generally, the elongated openings and the localized openings may be arranged to define at least one bonding pad region that is free of the elongated openings, localized openings, and underlying lower-level bonding pads 166. In one embodiment, the elongated openings may have a respective rectangular horizontal cross-sectional shape having a length-to-width ratio in a range from 3:1 to 10,000:1. The width of each elongated opening may be in a range from 0.5 micron to 10 microns, such as from 1 micron to 5 microns. In case the localized openings have rectangular shapes, the sides of the rectangular shapes of the localized openings can be in a range from 0.5 microns to 30 microns, such as from 1 micron to 10 microns.

An etch process can be performed to transfer the pattern of the openings through an upper portion of the first dielectric material layers 140. An anisotropic or an isotropic etch process can be performed to etch unmasked portions of the first dielectric material layers 140 underneath the openings in the photoresist layer. The photoresist layer can be employed as an etch mask for the anisotropic etch process. Vertical recesses are formed within each volume from which the materials of the first dielectric material layers 140 are removed. Each of the vertical recesses vertically extends from the topmost surface of the first dielectric material layers 140 toward the first substrate 109. The vertical recesses that underlie the elongated openings are herein referred to as the line cavities 181 as in the first embodiment. The vertical recesses that underlie the localized openings are herein referred to as pillar cavities 191. The line cavities 181 and the pillar cavities 191 may have vertical or substantially vertical sidewalls, and may have a depth that is in a range from 10% to 99%, such as from 20% to 60% and/or from 30% to 50%, of the thickness of the first dielectric material layers 140. For example, the depth of the line cavities 181 and the pillar cavities 191 may be in a range from 0.5 microns to 5 microns. In one embodiment, at least one of the line cavities 181, and/or each of the line cavities 181, may have a respective uniform vertical cross-sectional shape along vertical planes that are perpendicular to a respective lengthwise direction. If an isotropic etch process is used, then the line cavities 181 and the pillar cavities 191 may have concave sidewalls with undercuts underneath the photoresist layer. The photoresist layer may be subsequently removed, for example, by ashing.

Figure 12A:
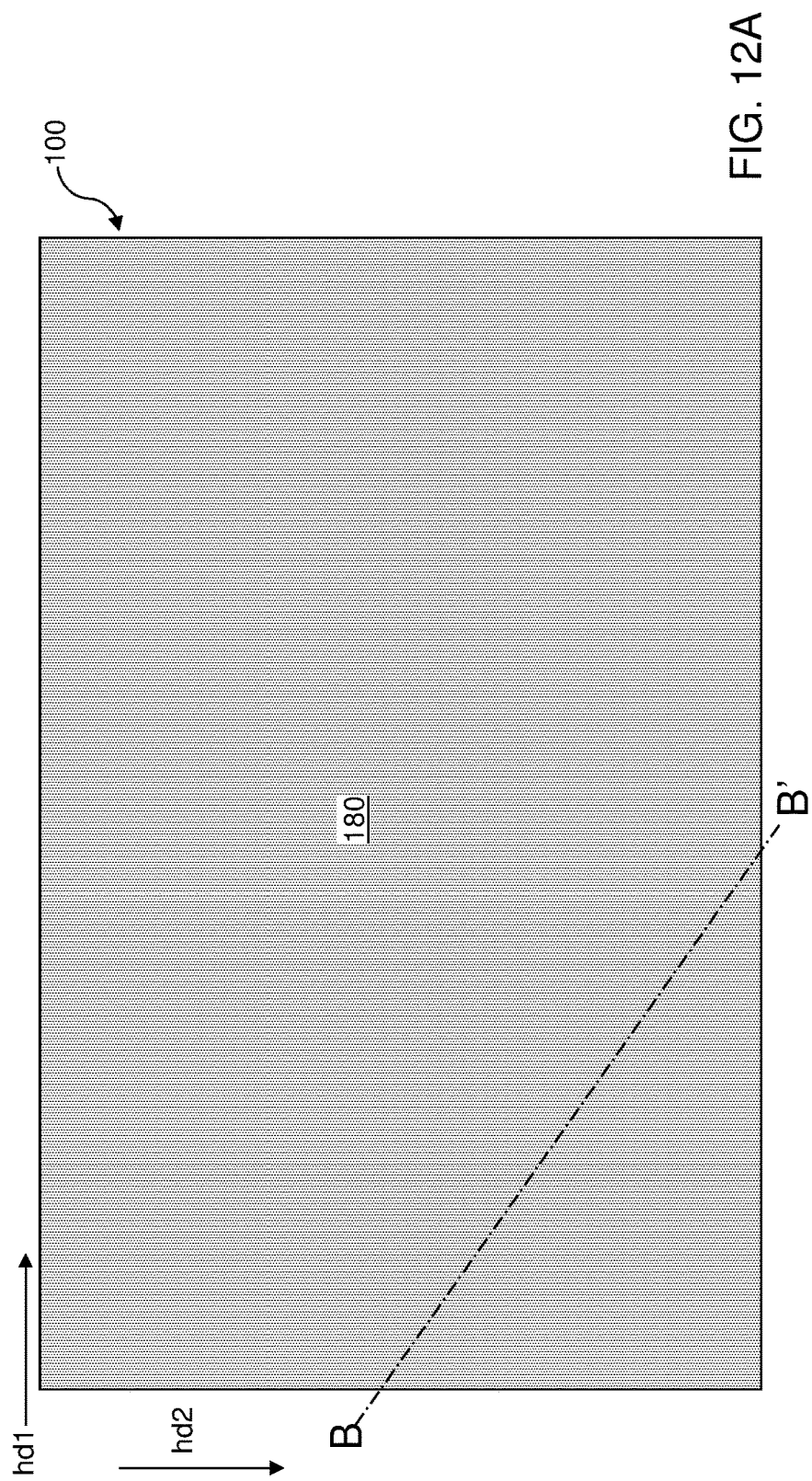
FIG. 12A is a top-down view of the second exemplary structure after formation of a compressive-stress silicon nitride material layer according to the second embodiment of the present disclosure.
Figure 12B:
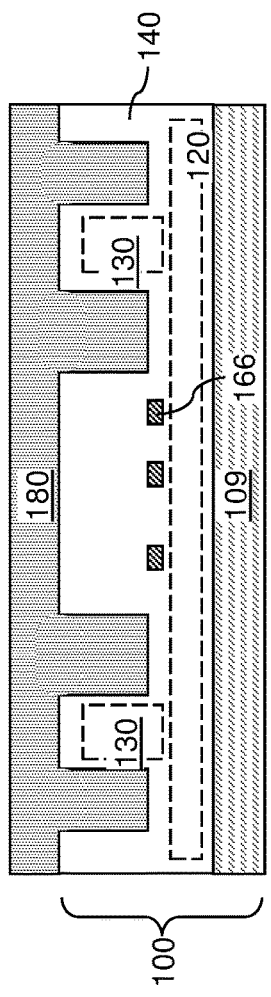
FIG. 12B is a vertical cross-sectional view along the vertical plane B-B' of the second exemplary structure of FIG. 12A.

Referring to FIGS. 12A and 12B, a compressive-stress silicon nitride material can be deposited in the line cavities 181 and the pillar cavities 191 and over the top surface of the first dielectric material layers 140 to form a compressive-stress silicon nitride layer 180. The compressive-stress silicon nitride material can be deposited employing a plasma-enhanced chemical vapor deposition (PECVD) process in which hydrogen atoms are incorporated into the deposited silicon nitride material. The compressive-stress silicon nitride layer 180 in the second exemplary structure can have the same material composition and physical properties as the compressive-stress silicon nitride layer 180 in the first exemplary structure, and may be formed employing the same deposition method as in the first embodiment.

Figure 13A:
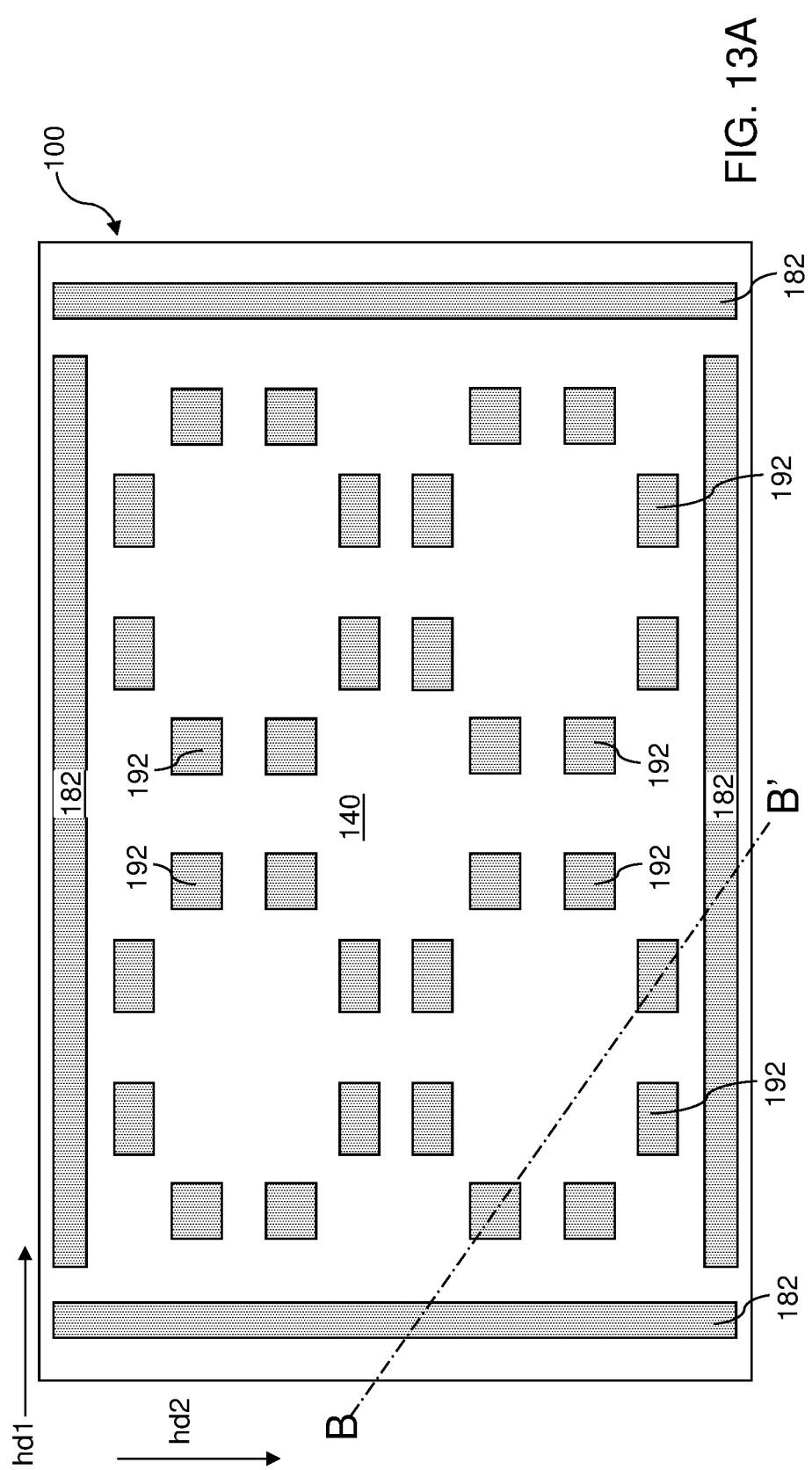
FIG. 13A is a top-down view of the second exemplary structure after formation of compressive-stress silicon nitride material strips and compressive-stress silicon nitride material pillars according to the second embodiment of the present disclosure.
Figure 13B:
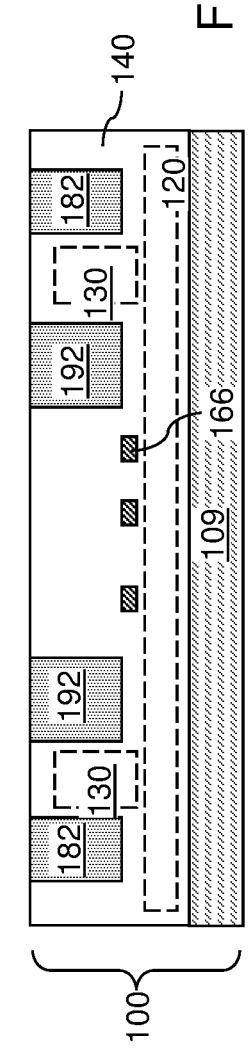
FIG. 13B is a vertical cross-sectional view along the vertical plane B-B' of the second exemplary structure of FIG. 13A.

Referring to FIGS. 13A and 13B, the horizontally-extending portion of the compressive-stress silicon nitride layer 180 that overlies the top surface of the first dielectric material layers 140 can be removed without removing the portions of the compressive-stress silicon nitride layer 180 that fill the line cavities 181 and the pillar cavities 191. For example, an isotropic etch process such as a wet etch process employing hot phosphoric acid can be performed to etch back the horizontally-extending portion of the compressive-stress silicon nitride layer 180 that overlie the horizontal plane including the top surface of the first dielectric material layers 140. Alternatively or additionally, a chemical mechanical planarization process may be employed to remove all, or a portion, of the horizontally-extending portion of the compressive-stress silicon nitride layer 180 that overlies the horizontal plane including the top surface of the first dielectric material layers 140.

Each remaining portion of the compressive-stress silicon nitride layer 180 that fills a respective one of the line cavities 181 constitutes a compressive-stress silicon nitride material strip 182. Each compressive-stress silicon nitride material strip 182 can laterally extend along a respective lengthwise direction, which may be the first horizontal direction hd1 or the second horizontal direction hd2. Each compressive-stress silicon nitride material strip 182 is a silicon nitride material portion that includes a silicon nitride material under compressive stress that applies tensile stress to respective neighboring material portions. In case a chemical mechanical planarization process is employed to remove portions of the compressive-stress silicon nitride layer 180 that overlie the horizontal plane including the top surface of the first dielectric material layers 140, the top surfaces of the compressive-stress silicon nitride material strips 182 may be located within the horizontal plane including the top surface of the first dielectric material layers 140.

Each remaining portion of the compressive-stress silicon nitride layer 180 that fills a respective one of the pillar cavities 191 constitutes a compressive-stress silicon nitride material pillar 192. Each compressive-stress silicon nitride material pillar 192 may have a polygonal horizontal cross-sectional shape or a generally curvilinear horizontal cross-sectional shape. Each compressive-stress silicon nitride material pillar 192 is a silicon nitride material portion that includes a silicon nitride material under compressive stress that applies tensile stress to respective neighboring material portions. In case a chemical mechanical planarization process is employed to remove portions of the compressive-stress silicon nitride layer 180 that overlie the horizontal plane including the top surface of the first dielectric material layers 140, the top surfaces of the compressive-stress silicon nitride material pillars 192 may be located within the horizontal plane including the top surface of the first dielectric material layers 140. In one embodiment, a set of compressive-stress silicon nitride material pillars 192 may be arranged along a periphery of an area that includes a respective array of lower-level bonding pads 166.

Figure 14A:
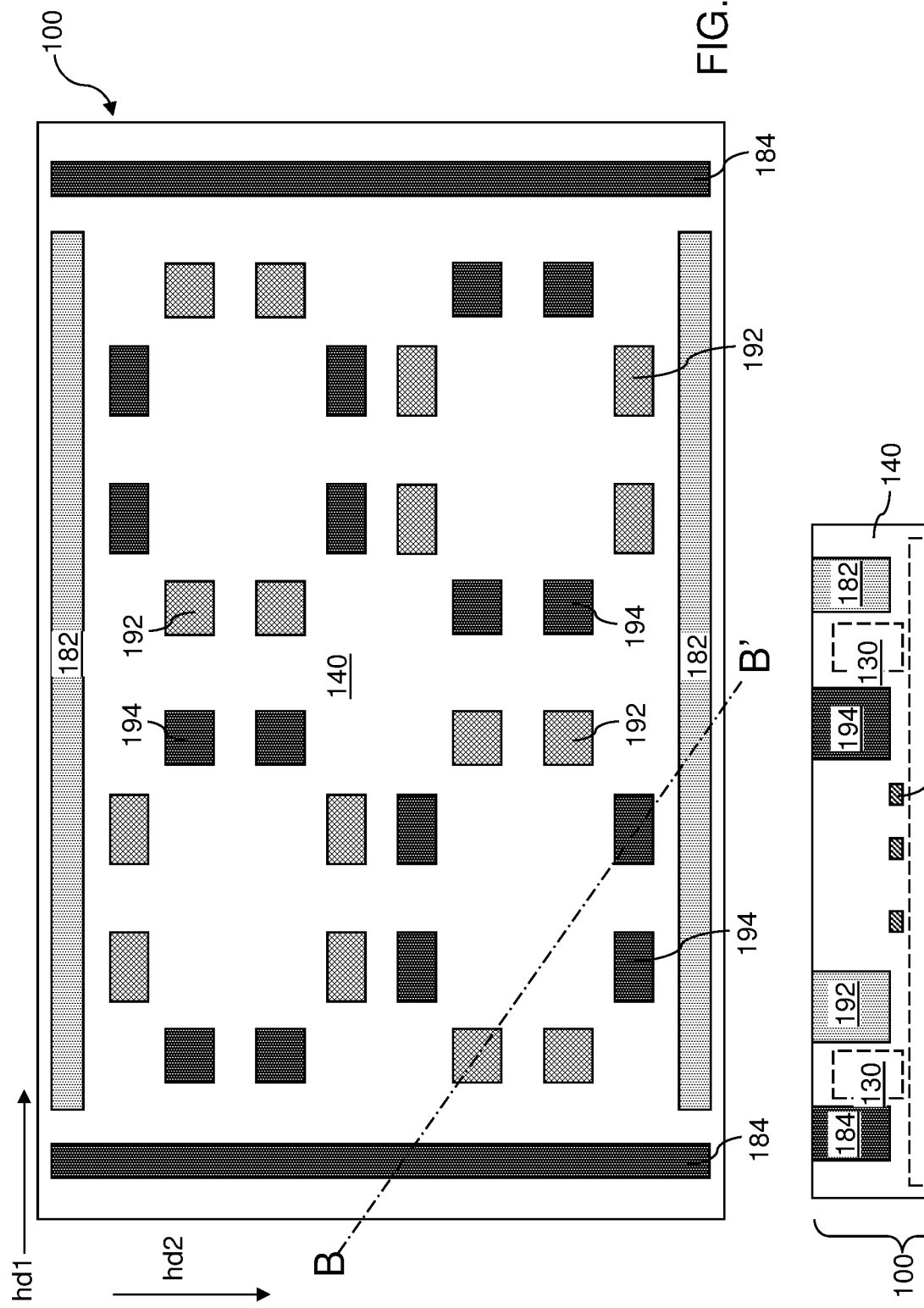
FIG. 14A is a top-down view of the second exemplary structure after conversion of a subset of the compressive-stress silicon nitride material strips into tensile-stress silicon nitride material strips and conversion of a subset of the compressive-stress silicon nitride material pillars into tensile-stress silicon nitride material pillars according to the second embodiment of the present disclosure.
Figure 14B:
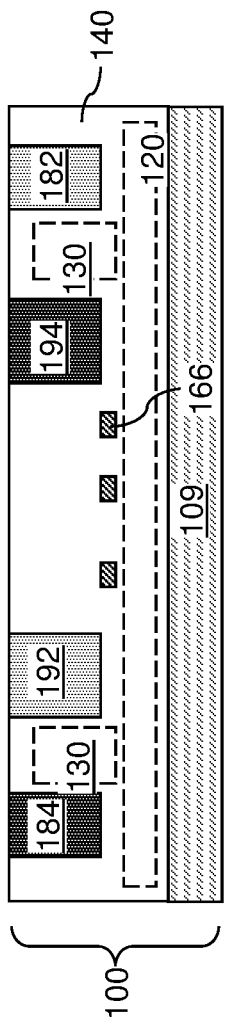
FIG. 14B is a vertical cross-sectional view along the vertical plane B-B' of the second exemplary structure of FIG. 14A.

Referring to FIGS. 14A and 14B, as in the first embodiment a subset of the compressive-stress silicon nitride material strips 182 and the compressive-stress silicon nitride material pillars 192 can be locally annealed with laser irradiation. A first subset of the compressive-stress silicon nitride material strips 182 that is not irradiated with a laser beam comprises first silicon nitride material strips 182 that are under compressive stress and apply a tensile stress to respective surrounding material portions, and a second subset of the compressive-stress silicon nitride material strips 182 that is irradiated with the laser beam comprises second silicon nitride material strips 184 that are under tensile stress and apply compressive stress to respective surrounding material portions. In other words, a first subset of the compressive-stress silicon nitride material strips 182 that is not irradiated with the laser beam is hereafter referred to as first silicon nitride material strips 182, and a second subset of the compressive-stress silicon nitride material strips 182 that is irradiated with the laser beam is hereafter referred to as second silicon nitride material strips 184.

A first subset of the compressive-stress silicon nitride material pillars 192 that is not irradiated with a laser beam comprises first silicon nitride material pillars 192 that are under compressive stress and apply tensile stress to respective surrounding material portions, and a second subset of the compressive-stress silicon nitride material pillars 192 that is irradiated with the laser beam comprises second silicon nitride material pillars 194 that are under tensile stress and apply compressive stress to respective surrounding material portions. In other words, a first subset of the compressive-stress silicon nitride material pillars 192 that is not irradiated with the laser beam is hereafter referred to as first silicon nitride material pillars 192, and a second subset of the compressive-stress silicon nitride material pillars 192 that is irradiated with the laser beam is hereafter referred to as second silicon nitride material pillars 194.

The subset of the compressive-stress silicon nitride material strips 182 to be converted into the second silicon nitride material strips 184 by laser irradiation and the subset of the compressive-stress silicon nitride material pillars 192 to be converted into the second silicon nitride material pillars 194 by laser irradiation may be selected for each first semiconductor die 100 as in the first embodiment.

Generally, the first silicon nitride material strips 182, the second silicon nitride material strips 184, the first silicon nitride material pillars 192, the second silicon nitride material pillars 194 can be positioned in any manner that reduces the overall strain and the deformation of the first semiconductor die 100. In some cases, aligning the lengthwise directions of the first silicon nitride material strips 182 along one horizontal direction and aligning the lengthwise directions of the second silicon nitride material strips 184 along another horizontal direction may be advantageous in reducing the overall deformation of the first semiconductor die 100. Such cases can occur if major stress components of the first semiconductor devices 120 (such as the word lines 46) are arranged along a same horizontal direction. In one embodiment, the first silicon nitride material strips 182 can laterally extend along a first lengthwise direction (such as the first horizontal direction hd1), and the second silicon nitride material strips 184 can laterally extend along a second lengthwise direction (such as the second horizontal direction hd2) that is different from (e.g., orthogonal to) the first lengthwise direction.

In one embodiment, the first silicon nitride material pillars 192 and the second silicon nitride material pillars 194 can be arranged along a periphery of an area including the lower-level bonding pads 166. The first silicon nitride material pillars 192 and the second silicon nitride material pillars 194 can be located outside the areas of the lower-level bonding pads 166. Sidewalls of the first silicon nitride material pillars 192 and the second silicon nitride material pillars 194 may be aligned to the periphery of a respective area including a respective array of lower-level bonding pads 166.

Figure 15A:
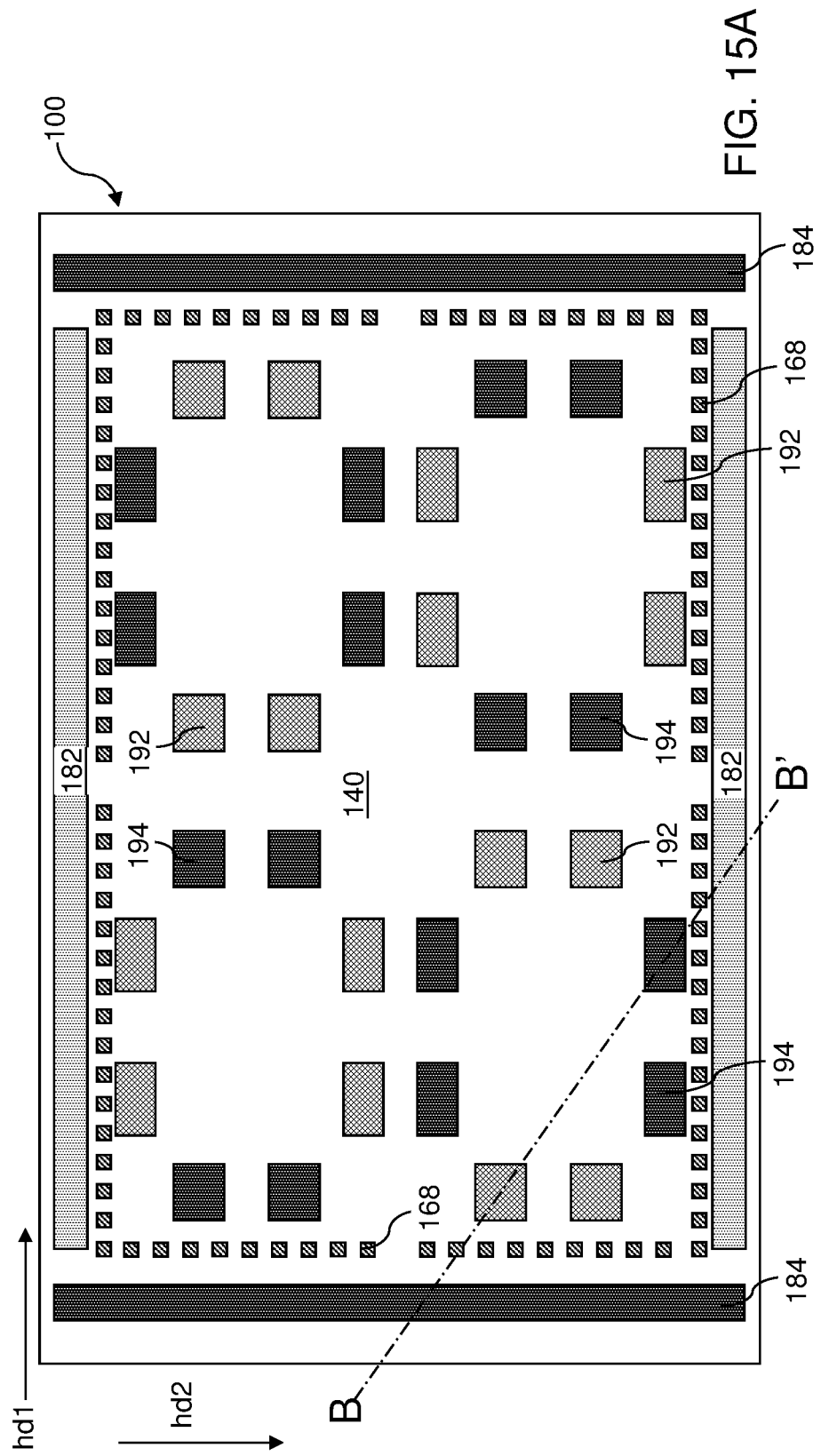
FIG. 15A is a top-down view of the second exemplary structure after formation of first bonding pads according to the second embodiment of the present disclosure.
Figure 15B:
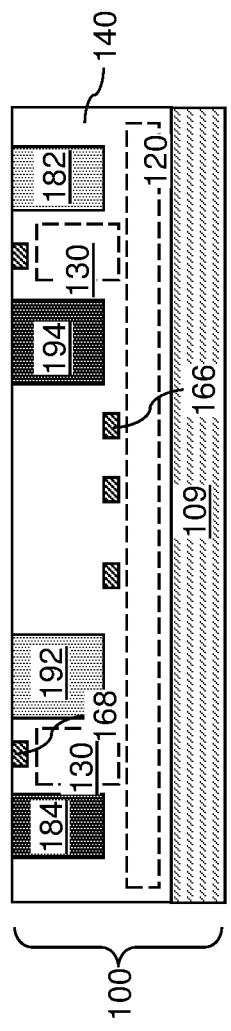
FIG. 15B is a vertical cross-sectional view along the vertical plane B-B' of the second exemplary structure of FIG. 15A.

Referring to FIGS. 15A and 15B, an optional photoresist layer (not shown) can be applied over the first dielectric material layers 140, the first silicon nitride material strips 182, the second silicon nitride material strips 184, the first silicon nitride material pillars 192, and the second silicon nitride material pillars 194, and can be lithographically patterned to form an optional array of openings. Each opening can have a polygonal shape or a shape of a rounded polygon, i.e., a shape of a polygon that is modified to replace angular corners with rounded corners. The openings can be formed in areas that do not overlie any of the first silicon nitride material strips 182, the second silicon nitride material strips 184, the first silicon nitride material pillars 192, the second silicon nitride material pillars 194, and the lower-level bonding pads 166 (which are buried bonding pads). An anisotropic etch process can be performed to transfer the pattern of the array of openings through an upper portion of the first dielectric material layers 140. An optional array of pad cavities can be formed in regions that are not masked by the photoresist layer. A top surface of an underlying metal interconnect structure (such as a metal pad, a metal line, or a metal via structure) can be physically exposed at the bottom of each pad cavity. The photoresist layer can be subsequently removed, for example, by ashing.

At least one metallic material can be optionally deposited in the array of pad cavities. The at least one metallic material can include, for example, a metallic nitride material such as TiN, TaN, or WN, and a metallic fill material such as Cu or a copper-containing alloy. Excess portions of the at least one metallic material can be removed from above the horizontal plane including the top surface of the first dielectric material layers 140 by a planarization process. For example, a chemical mechanical planarization process can be employed to remove the portions of the at least one metallic material that overlie the horizontal plane including the top surface of the first dielectric material layers 140. The remaining portions of the at least one metallic material that fill the array of pad cavities constitute optional first bonding pads 168. In an alternative embodiment, the first bonding pads 168 may be omitted if a second semiconductor die to be bonded to the first semiconductor die 100 does not extend to peripheral regions of the first semiconductor die 100 in which the first bonding pads 168 are located in FIG. 16A.

Thus, the first bonding pads 168 are either omitted or are located in an upper portion of the first dielectric material layers 140. The lower-level bonding pads 166 are vertically recessed from the top surface of the first dielectric material layers 140 and from the first bonding pads 168 (if present). The lower-level bonding pads 166 are covered with the first upper-level dielectric material layers 140B, which include the upper portion of the first dielectric material layers 140. Top surfaces of the first bonding pads 168 (if present) can be formed within the horizontal plane including the topmost surface of the first dielectric material layers 140. The first bonding pads 168 can be formed in regions in which the silicon nitride material strips (182, 184) and the silicon nitride material pillars (192, 194) are not present. The optional first bonding pads 168 are formed after locally annealing a subset of the silicon nitride material strips 182 and a subset of the silicon nitride material pillars 192 as provided at the processing steps of FIGS. 13A and 13B with the laser irradiation.

Generally, the first bonding pads 168 can be embedded in the upper portion of the first dielectric material layers 140. Reduction of the deformation of the first semiconductor die 100 at the processing steps of FIGS. 14A and 14B provides a more planar topmost surface of the first dielectric material layers 140, and thus, enables formation of the first bonding pads 168 with higher planarity in the upper portion of the first dielectric material layers 140. The top surfaces of the first bonding pads 168 are located in the horizontal plane including the top surface of the first dielectric material layers 140. The top surfaces of the first silicon nitride material strips 182, the second silicon nitride material strips 184, the first silicon nitride material pillars 192, and the second silicon nitride material pillars 194 can be within the horizontal plane that includes the top surface of the first dielectric material layers 140.

Referring to FIGS. 16A and 16B, a photoresist layer can be applied over the first dielectric material layers 140, and can be lithographically patterned to form at least one opening therethrough. Each opening in the photoresist layer can be formed in an area that overlies an array of lower-level bonding pads 166, which are buried bonding pads. An etch process can be performed to remove unmasked portions of the first dielectric material layers 140 that underlie the openings in the photoresist layer. The etch process may be an anisotropic etch process (such as a reactive ion etch process), and/or may be an isotropic etch process (such as a wet etch process). The duration of the etch process can be selected such that the portions 140B of the first dielectric material layers 140 that overlie each array of lower-level bonding pads 166 are removed by the etch process, and top surfaces of the lower-level bonding pads 166 are physically exposed. The lower-level bonding pads 166 are vertically recessed relative to the first bonding pads 168 (if present). As such, the lower-level bonding pads 166 are hereafter referred to as recessed bonding pads.

A void that is laterally surrounded by an upper portion of the first dielectric material layers 140 is present above each array of lower-level bonding pads 166. Each region including a void that overlies a respective array of lower-level bonding pads 166 (i.e., an array of recessed bonding pads) is herein referred to as a crater region 167. As used herein, a crater region refers to a recess region having a lateral dimension of at least 1 mm along two perpendicular horizontal directions (such as the first horizontal direction hd1 and the second horizontal direction hd2). The depth of each crater region 167 can be at least the height difference between the horizontal plane including the top surfaces of the first dielectric material layers 140 (and the top surfaces of the first bonding pads 168 if present) and the horizontal plane including the top surfaces of the lower-level bonding pads 166, and is less than the height difference between the horizontal plane including the top surfaces of the first dielectric material layers 140 (and the top surfaces of the first bonding pads 168 if present) and the horizontal plane including the bottom surfaces of the lower-level bonding pads 166. Generally, the crater regions 167 can be formed by vertically recessing portions of the first upper-level dielectric material layers 140B that overlie an array of lower-level bonding pads 166. Top surfaces of the buried bonding pads (i.e., the lower-level bonding pads 166 as covered by the first dielectric material layers 140) are physically exposed underneath each crater region 167, and the buried bonding pads become recessed bonding pads (i.e., the lower-level bonding pads 166 with physically exposed top surfaces).

In one embodiment, a sidewall of at least one of the silicon nitride material pillars (192, 194) and the silicon nitride material strips (182, 184) can be physically exposed to the crater region(s) 167. In one embodiment, at least one of first silicon nitride material portions generating tensile stress (such as the first silicon nitride material pillars 192 and the first silicon nitride material strips 182) and second silicon nitride material portions generating compressive stress (such as the second silicon nitride material pillars 194 and the second silicon nitride material strips 184) can have a sidewall that is physically exposed to the cavity of the crater region 167.

In one embodiment, the cavity of the crater region 167 is laterally bounded by four sidewalls, one of the first silicon nitride material portions (such as the first silicon nitride material pillars 192 and/or the first silicon nitride material strips 182) is physically exposed at one of the four sidewalls, and one of the second silicon nitride material portions (such as the second silicon nitride material pillars 194 and/or the second silicon nitride material strips 184) is physically exposed at another one of the four sidewalls. In this configuration, a combination of a directional compressive stress and a directional tensile stress can be orthogonally applied around a crater region 167 to compensate for a directional local distortion of the first semiconductor die 100. For example, in one crater region 167, one of the first or second silicon nitride material pillars 192, 194 are exposed in the first and second sidewalls which extend in the first horizontal direction hd1, and the other one of the first or second silicon nitride material pillars 192, 194 are exposed in the third and fourth sidewalls which extend in the second horizontal direction hd2.

In one embodiment, the first semiconductor die 100 can comprise a plurality of crater regions 167 in which a respective recessed horizontal surface of the first dielectric material layers 140 is vertically recessed from a horizontal plane including the top surfaces of the first bonding pads 168. In some crater regions 167A, 167D shown in FIG. 16A, the first silicon nitride material pillars 192 are exposed in the first and second sidewalls which extend in the first horizontal direction hd1, and the second silicon nitride material pillars 194 are exposed in the third and fourth sidewalls which extend in the second horizontal direction hd2. Other crater regions 167B, 167C shown in FIG. 16A, the second silicon nitride material pillars 194 are exposed in the first and second sidewalls which extend in the first horizontal direction hd1, and the first silicon nitride material pillars 192 are exposed in the third and fourth sidewalls which extend in the second horizontal direction hd2.

Referring to FIGS. 17A and 17B, a second semiconductor die 200 is illustrated, which is configured to be bonded to the first semiconductor die 100. The second semiconductor die 200 includes a second substrate 209, second semiconductor devices 220 located on the second substrate 209, second dielectric material layers 240 located on the second semiconductor devices 220 and embedding second metal interconnect structures 230. The second dielectric material layers 240 can include second lower-level dielectric material layers that embed a subset of the second metal interconnect structures 230, and are proximal to the second substrate 209.

Optional second bonding pads 268 can be formed in an upper portion of the second lower-level dielectric material layers. The second bonding pads 268 can be electrically connected to a respective node of the second semiconductor devices 220. The pattern of the second bonding pads 268 (if present) can be a mirror image pattern of the pattern of the first bonding pads 168 (if present) of the first semiconductor die 100.

Subsequently, second upper-level dielectric material layers can be formed over the second lower-level dielectric material layers and the second bonding pads 268. The second upper-level dielectric material layers and the second lower-level dielectric material layers collectively constitute the second dielectric material layers 240. The second upper-level dielectric material layers can embed another subset of the second metal interconnect structures 230. Additional bonding pads can be formed in an upper portion of the second upper-level dielectric material layers. The additional bonding pads are formed above the second bonding pads 268, and are herein referred to as raised bonding pads 266. The pattern of the raised bonding pads 266 can be the mirror image pattern of the pattern of the lower-level bonding pads 166 (i.e., the recessed bonding pads) of the first semiconductor die 100. The height difference between the top surfaces of the second bonding pads 268 and the raised bonding pads 266 in the second semiconductor die 200 can be the same as the height difference between the top surfaces of the first bonding pads 168 and the lower-level bonding pads 166 (i.e., the recessed bonding pads) in the first semiconductor die 100.

Portions of the second dielectric material layers 240 located within the areas of the mirror image of the areas of the unrecessed surfaces of the first semiconductor die 100 can be vertically recessed by an etch process. A patterned photoresist layer may be employed to define areas to be vertically recessed during the etch process. The etch process can include an anisotropic etch process (such as a reactive ion etch process) or an isotropic etch process (such as a wet etch process). The areas of the unrecessed surfaces of the first semiconductor die 100 include all areas of the first semiconductor die 100 other than the areas of the crater regions 167. In other words, the areas of the unrecessed surfaces of the first semiconductor die 100 include areas of the topmost surface of the first dielectric material layers 140 and the areas of the silicon nitride material portions (182, 184, 192, 194). Thus, the areas of the portions of the second dielectric material layers 240 that face the areas of the topmost surface of the first dielectric material layers 140 and the areas of the silicon nitride material portions (182, 184, 192, 194) of the first semiconductor die 100 in a subsequent bonding process are vertically recessed.

In one embodiment, the first semiconductor devices 120 in the first semiconductor die 100 can include a three-dimensional array of memory elements, and the second semiconductor devices 220 in the second semiconductor die 200 can include a peripheral circuit configured to control the operation of the three-dimensional array of memory elements in the first semiconductor die 100. Generally, the first semiconductor devices 120 and the second semiconductor devices 220 may be selected to provide complementary functionalities so that a bonded assembly of the first semiconductor die 100 and the second semiconductor die 200 provides enhanced functionality or full functionality that the first semiconductor die 100 alone, or the second semiconductor die 200 alone, does not provide.

Each unrecessed portion of the second dielectric material layers 240 constitutes a mesa portion that protrudes upward from the second substrate 209. The horizontal cross-sectional shape of each mesa portion of the second semiconductor die 200 can be the same as, or less than, the horizontal cross-sectional shape of a corresponding crater region 167 into which the mesa portion is to be subsequently inserted. The raised bonding pads 266 are located at a planar surface of the mesa portion(s). Generally, each mesa portion in the second dielectric material layers 240 can be formed by recessing a respective peripheral portion of the second dielectric material layers 240 that surrounds the mesa portion. The patterned photoresist layer can be subsequently removed, for example, by ashing.

Figure 18A:
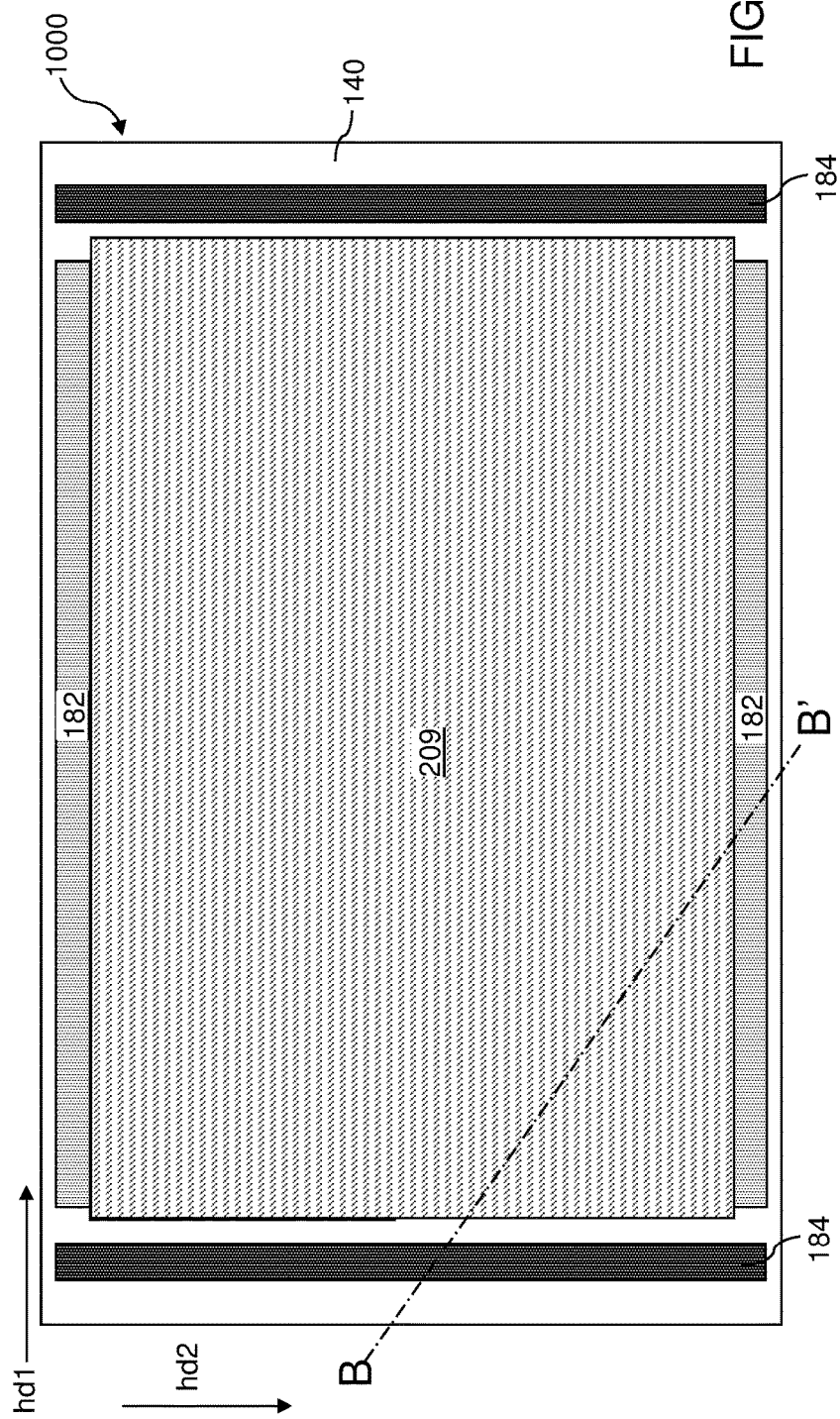
FIG. 18A is a top-down view of the second exemplary structure after formation of a bonded assembly of the first semiconductor die and the second semiconductor die according to the second embodiment of the present disclosure.
Figure 18B:
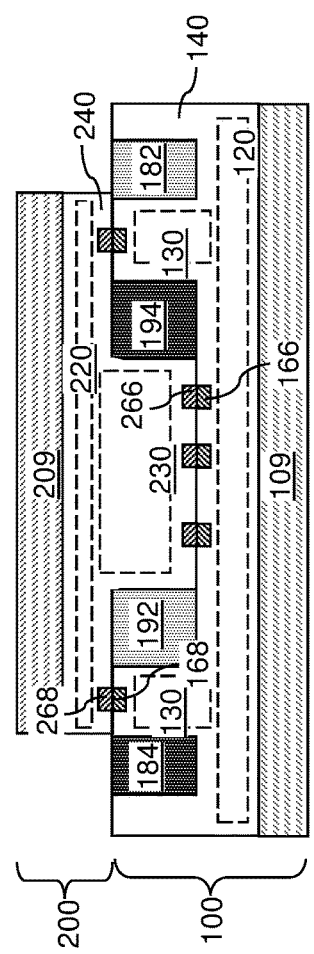
FIG. 18B is a vertical cross-sectional view along the vertical plane B-B' of the second exemplary structure of FIG. 18A.

Referring to FIGS. 18A and 18B, the second semiconductor die 200 can be disposed over the first semiconductor die 100 such that each second bonding pad 268 (if present) faces a respective one of the first bonding pads 168 (if present), and each raised bonding pad 266 faces a respective one of the recessed bonding pads (i.e., the lower-level bonding pads 166). The second semiconductor die 200 can be bonded to the first semiconductor die 100 with the mesa portion of the second semiconductor die 200 located within a respective crater region 167 of the first semiconductor die 100.

A metal-to-metal bonding can be induced to bond each mating pair of a first bonding pad 168 and a second bonding pad 268 and each mating pair of a recessed bonding pad (i.e., a lower-level bonding pad 166) and a raised bonding pad 266. For example, an anneal process can be performed in a temperature range from 150 degrees Celsius to 400 degrees Celsius. Optionally, dielectric-to-dielectric bonding such as oxide-to-oxide bonding can be induced between the first dielectric material layers 140 and the second dielectric material layers 240. In this case, the anneal temperature may be in a range from 250 degrees Celsius to 500 degrees Celsius. A bonded assembly 1000 of the first semiconductor die 100 and the second semiconductor die 200 can be formed. Warpage and distortion of the first semiconductor die 100 can be reduced at the processing steps of FIGS. 14A and 14B through local adjustment of stress by selective conversion of a subset of the compressive-stress silicon nitride material strips 182 into tensile-stress silicon nitride material strips 184, and by conversion of a subset of the compressive-stress silicon nitride material pillars 192 into tensile-stress silicon nitride material pillars 194.

In one embodiment, the first semiconductor die 100 can comprise at least one crater region 167 in which a recessed horizontal surface of the first dielectric material layers 140 is vertically recessed from a horizontal bonding interface between the first bonding pads 168 and the second bonding pads 268 toward the first substrate 109 to provide a cavity in a crater region 167, and the second semiconductor die 200 comprises at least one mesa portion that protrudes away from the second substrate 209 and at least partly fills the cavity in the crater region 167. The first semiconductor die 100 can comprise recessed bonding pads (i.e., the lower-level bonding pads 166) located at the recessed horizontal surface(s), and the second semiconductor die 200 comprises raised bonding pads 266 located at a planar surface of the mesa portion(s) and bonded to a respective one of the recessed bonding pads.

In one embodiment, the first semiconductor die 100 comprises a plurality of crater regions 167 in which a respective recessed horizontal surface of the first dielectric material layers 140 is vertically recessed from a horizontal bonding interface between the first bonding pads 168 and the second bonding pads 268 toward the first substrate 109 to provide a plurality of cavities located in a respective crater region 167, and the second semiconductor die 200 can comprises a plurality of mesa portions that protrude away from the second substrate 209 and at least partly fills a respective one of the plurality of cavities in the respective crater region 167.

Figure 19A:
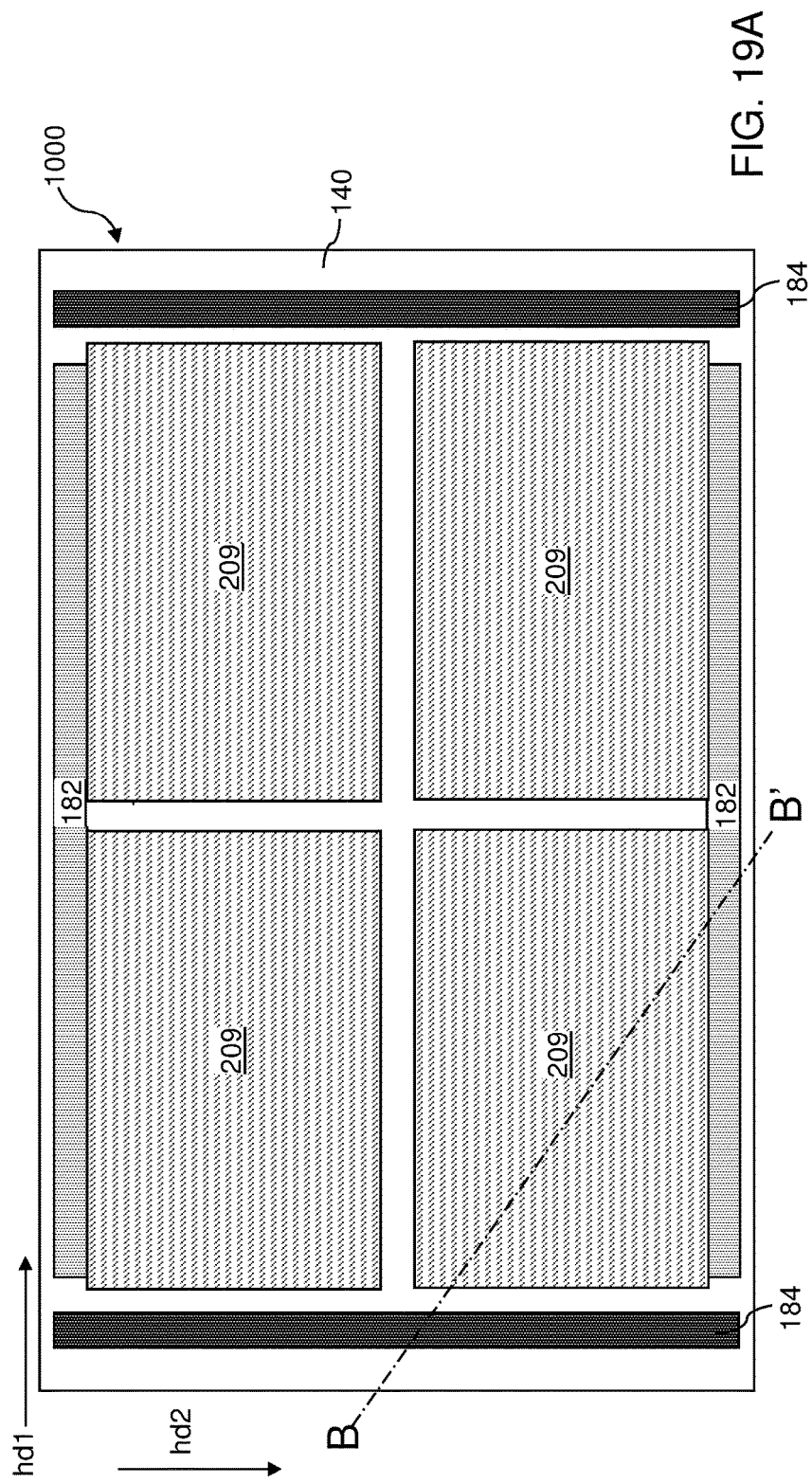
FIG. 19A is a top-down view of an alternative embodiment of the second exemplary structure after formation of a bonded assembly of the first semiconductor die and a plurality of second semiconductor dies according to the second embodiment of the present disclosure.
Figure 19B:
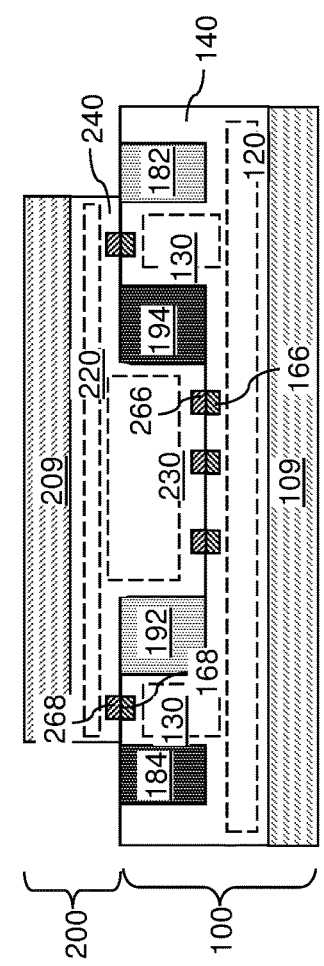
FIG. 19B is a vertical cross-sectional view along the vertical plane B-B' of the second exemplary structure of FIG. 19A.

Referring to FIGS. 19A and 19B, an alternative embodiment of the second exemplary structure is illustrated after formation of a bonded assembly of the first semiconductor die 100 and a plurality of second semiconductor dies 200 according to the second embodiment of the present disclosure. In the alternative embodiment, the second semiconductor die 200 in the structure of FIGS. 18A and 18B is replaced with a plurality of second semiconductor dies 200 each including a respective mesa portion. Each mesa portion can fit into a respective crater region 167 to provide bonding between each second bonding pad 268 and a respective one of the first bonding pads 168 and to provide bonding between each raised bonding pad 266 and a respective one of the recessed bonding pads (i.e., lower-level bonding pads 166).

In one embodiment, the first semiconductor die 100 comprises a plurality of crater regions 167 in which a respective recessed horizontal surface of the first dielectric material layers 140 is vertically recessed from a horizontal bonding interface between the first bonding pads 168 and the second bonding pads of the second semiconductor dies 200 toward the first substrate 108 to provide a plurality of cavities. Each second semiconductor die 200 comprises a mesa portion that protrudes away from the second substrate 209 toward the first substrate 109 and at least partly fills one of the plurality of cavities in the plurality of crater regions 167. The second semiconductor dies 200 are bonded to the first semiconductor die 100 at a respective one of the recessed horizontal surfaces of the first dielectric material layers 140 located a respective cavity of the plurality of crater regions 167.

In an alternative embodiment, a plurality of first semiconductor dies 100 may be bonded to a single second semiconductor die 200. In other words, the first and second semiconductor dies are interchangeable in terms of which die includes the crater regions and which die includes the mesa portions. Likewise, the silicon nitride stripes and/or pillars in compressive and/or tensile stress may be used in the first semiconductor die 100, in the second semiconductor die 200 or in both the first and second semiconductor dies.

Referring to FIGS. 20A and 20B, another alternative embodiment of the second exemplary structure is illustrated after formation of a bonded assembly of the first semiconductor die 100 and a plurality of second semiconductor dies 200 according to the second embodiment of the present disclosure. In this alternative embodiment, the second semiconductor dies 200 in the structure of FIGS. 19A and 19B includes only the mesa portion. In other words, the recessed portions in the second dielectric material layers 240 and the second bonding pads 268 are omitted in the second semiconductor dies 200. Likewise, the first bonding pads 168 in the first semiconductor die 100 may also be omitted.

The combination of crater regions 167 and the mesa portions can reduce the total thickness of the bonded assembly. The first substrate 109 and the second substrate 209 can be thinned from the backside, for example, by grinding, polishing, an anisotropic etch process, and/or an isotropic etch process to thin the bonded assembly. The total thickness of the bonded assembly after thinning the first substrate 109 and the second substrate 209 can be in a range from 30 microns to 100 microns.

The various embodiments of the present disclosure can be employed to provide local stress compensation and to reduce warpage and distortion of each first semiconductor die 100. Arrangement of compressive-stress elements (such as the compressive-stress silicon nitride material strips 182 and the compressive-stress silicon nitride material pillars 192) and tensile-stress elements (such as the tensile-stress silicon nitride material strips 184 and the tensile-stress silicon nitride material pillars 194) can be used to compensate for distortions introduced to the top surface of the first dielectric material layers 140 due to the stress that elements within the first semiconductor devices 120 generate. The planarity of the bonding surface of the first semiconductor die 100, e.g., the top surface of the first dielectric material layers 140 or the bottom crater 167 surface, can be improved through use of the complementary stress compensating elements in the first semiconductor die 100. Further, the stress compensating elements of the embodiments of the present disclosure remain within the bonded assembly. Thus, the stress compensating elements remain in an operational semiconductor chip, and provide enhanced reliability to the bonding surfaces through stress compensation.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure comprising a first semiconductor die, wherein the first semiconductor die comprises:
   a first substrate;
   first semiconductor devices located over the first substrate;
   a first dielectric material layer located over the first semiconductor devices;
   first silicon nitride material portions embedded within an upper portion of the first dielectric material layer and applying tensile stress to respective surrounding material portions;
   second silicon nitride material portions embedded within the upper portion of the first dielectric material layer and applying compressive stress to respective surrounding material portions; and
   first bonding pads embedded in the upper portion of the first dielectric material layer;
   wherein:
   the first silicon nitride material portions comprise strips which laterally extend along a first lengthwise direction;

the second silicon nitride material portions comprise strips which laterally extend along a second lengthwise direction that is different from the first lengthwise direction;

top surfaces of the first silicon nitride material portions and top surfaces of the second silicon nitride material portions are within a horizontal plane that includes a top surface of the first dielectric material layer; and top surfaces of the first bonding pads are located in the horizontal plane including the top surface of the first dielectric material layer.

2. A semiconductor structure comprising a first semiconductor die and a second semiconductor die, wherein:
the first semiconductor die comprises:
a first substrate;
first semiconductor devices located over the first substrate;
a first dielectric material layer located over the first semiconductor devices;
first silicon nitride material portions embedded within an upper portion of the first dielectric material layer and applying tensile stress to respective surrounding material portions;
second silicon nitride material portions embedded within the upper portion of the first dielectric material layer and applying compressive stress to respective surrounding material portions; and
first bonding pads embedded in the upper portion of the first dielectric material layer;
the second semiconductor die that comprises:
a second substrate;
second semiconductor devices located over the second substrate;
a second dielectric material layer located over the second semiconductor devices; and
second bonding pads embedded in the second dielectric material layer and bonded to a respective one of the first bonding pads;
the first semiconductor die comprises a crater region in which a recessed horizontal surface of the first dielectric material layer is vertically recessed from a horizontal bonding interface between the first bonding pads and the second bonding pads toward the first substrate to provide a cavity; and
the second semiconductor die comprises a mesa portion that protrudes away from the second substrate and at least partly fills the cavity in the crater region.

3. The semiconductor structure of claim 2, wherein:
the first semiconductor die comprises recessed bonding pads located at the recessed horizontal surface; and
the second semiconductor die comprises raised bonding pads located at a planar surface of the mesa portion and bonded to a respective one of the recessed bonding pads.

4. The semiconductor structure of claim 2, wherein:
the cavity of the crater region is laterally bounded by four sidewalls;
one of the first silicon nitride material portions is physically exposed at one of the four sidewalls; and
one of the second silicon nitride material portions is physically exposed at another of the four sidewalls.

5. A semiconductor structure comprising a first semiconductor die and a second semiconductor die, wherein:
the first semiconductor die comprises:
a first substrate;
first semiconductor devices located over the first substrate;
a first dielectric material layer located over the first semiconductor devices;
first silicon nitride material portions embedded within an upper portion of the first dielectric material layer and applying tensile stress to respective surrounding material portions;
second silicon nitride material portions embedded within the upper portion of the first dielectric material layer and applying compressive stress to respective surrounding material portions; and
first bonding pads embedded in the upper portion of the first dielectric material layer; and
the second semiconductor die comprises:
a second substrate;
second semiconductor devices located over the second substrate;
a second dielectric material layer located over the second semiconductor devices; and
second bonding pads embedded in the second dielectric material layer and bonded to a respective one of the first bonding pads;
the first semiconductor die comprises a plurality of crater regions in which a respective recessed horizontal surface of the first dielectric material layer is vertically recessed from a horizontal bonding interface between the first bonding pads and the second bonding pads toward the first substrate to provide a plurality of cavities;
the second semiconductor die comprises a mesa portion that protrudes away from the second substrate and at least partly fills one of the plurality of cavities; and
additional semiconductor dies are bonded to the first semiconductor die at a respective one of the recessed horizontal surfaces of the first dielectric material layer located in cavities other than the cavity in the second semiconductor die is present.

6. A semiconductor structure comprising:
a first semiconductor die, wherein the first semiconductor die comprises:
a first substrate;
first semiconductor devices located over the first substrate;
a first dielectric material layer located over the first semiconductor devices;
first silicon nitride material portions embedded within an upper portion of the first dielectric material layer and applying tensile stress to respective surrounding material portions; and
second silicon nitride material portions embedded within the upper portion of the first dielectric material layer and applying compressive stress to respective surrounding material portions; and
a plurality of second semiconductor dies, each comprising a second substrate, second semiconductor devices located over the second substrate, a second dielectric material layer located over the second semiconductor devices, and second bonding pads embedded in the second dielectric material layer;
wherein:
the first semiconductor die further comprises crater regions in each of which a recessed horizontal surface of the first dielectric material layer is vertically recessed to provide a cavity, and recessed first bonding pads located at the recessed horizontal surface;
the plurality of second semiconductor dies are located in the respective crater regions in the first semiconductor die; and the second bonding pads are bonded to a respective one of the recessed first bonding pads.

7. The semiconductor structure of claim 6, wherein:
the first silicon nitride portions comprise both first silicon nitride strips and first silicon nitride pillars; and
the second silicon nitride portions comprise both second silicon nitride strips and second silicon nitride pillars.

\* \* \* \* \*